United States Patent
Tambo et al.

(10) Patent No.: US 12,372,412 B2
(45) Date of Patent: Jul. 29, 2025

(54) INFRARED SENSOR AND METHOD OF CONTROLLING INFRARED SENSOR

(71) Applicant: Panasonic Intellectual Property Management Co., Ltd., Osaka (JP)

(72) Inventors: Naoki Tambo, Kyoto (JP); Masaki Fujikane, Osaka (JP); Kunihiko Nakamura, Osaka (JP); Kosei Ohura, Osaka (JP); Yasuyuki Naito, Osaka (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 252 days.

(21) Appl. No.: 18/051,548

(22) Filed: Nov. 1, 2022

(65) Prior Publication Data

US 2023/0088920 A1 Mar. 23, 2023

Related U.S. Application Data

(63) Continuation of application No. PCT/JP2021/016257, filed on Apr. 22, 2021.

(30) Foreign Application Priority Data

May 25, 2020 (JP) .................................. 2020-090765

(51) Int. Cl.
*G01J 5/14* (2006.01)
*G01J 5/20* (2006.01)
*H10N 10/17* (2023.01)

(52) U.S. Cl.
CPC . *G01J 5/14* (2013.01); *G01J 5/20* (2013.01); *H10N 10/17* (2023.02)

(58) Field of Classification Search
CPC ...................................... G01J 5/14; G01J 5/20
See application file for complete search history.

(56) References Cited

U.S. PATENT DOCUMENTS

2004/0232337 A1 11/2004 Vilain
2005/0133721 A1 6/2005 Kim et al.
(Continued)

FOREIGN PATENT DOCUMENTS

| JP | 2004-530909 | 10/2004 |
| JP | 2005-181308 | 7/2005 |

(Continued)

OTHER PUBLICATIONS

International Search Report of PCT application No. PCT/JP2021/016257 dated Jul. 20, 2021.

*Primary Examiner* — Carolyn Fin
(74) *Attorney, Agent, or Firm* — Wenderoth, Lind & Ponack, L.L.P.

(57) ABSTRACT

An infrared sensor is provided with an infrared light receiver, a signal pathway, and a first member. The infrared light receiver has a structure in which at least two materials having different coefficients of thermal expansion are layered. The signal pathway includes a first signal pathway allowing passage of a driving signal to be applied to the infrared light receiver. The driving signal has a current value equal to or greater than a prescribed magnitude, and the infrared light receiver deforms in response to the application of the driving signal to the infrared light receiver, thereby at least a portion of the infrared light receiver contacting the first member.

12 Claims, 12 Drawing Sheets

(56) References Cited

U.S. PATENT DOCUMENTS

| | | | |
|---|---|---|---|
| 2017/0047499 A1 | 2/2017 | Hussein | |
| 2017/0069818 A1 | 3/2017 | Mitrovic et al. | |
| 2017/0356806 A1* | 12/2017 | Takahashi | G01J 5/023 |
| 2019/0178718 A1 | 6/2019 | Kawasaki et al. | |
| 2020/0003625 A1 | 1/2020 | Tambo et al. | |
| 2021/0055163 A1* | 2/2021 | Kang | G01J 5/024 |

FOREIGN PATENT DOCUMENTS

| | | |
|---|---|---|
| JP | 2017-223644 | 12/2017 |
| JP | 2019-105624 | 6/2019 |
| WO | 2019/225058 | 11/2019 |

* cited by examiner

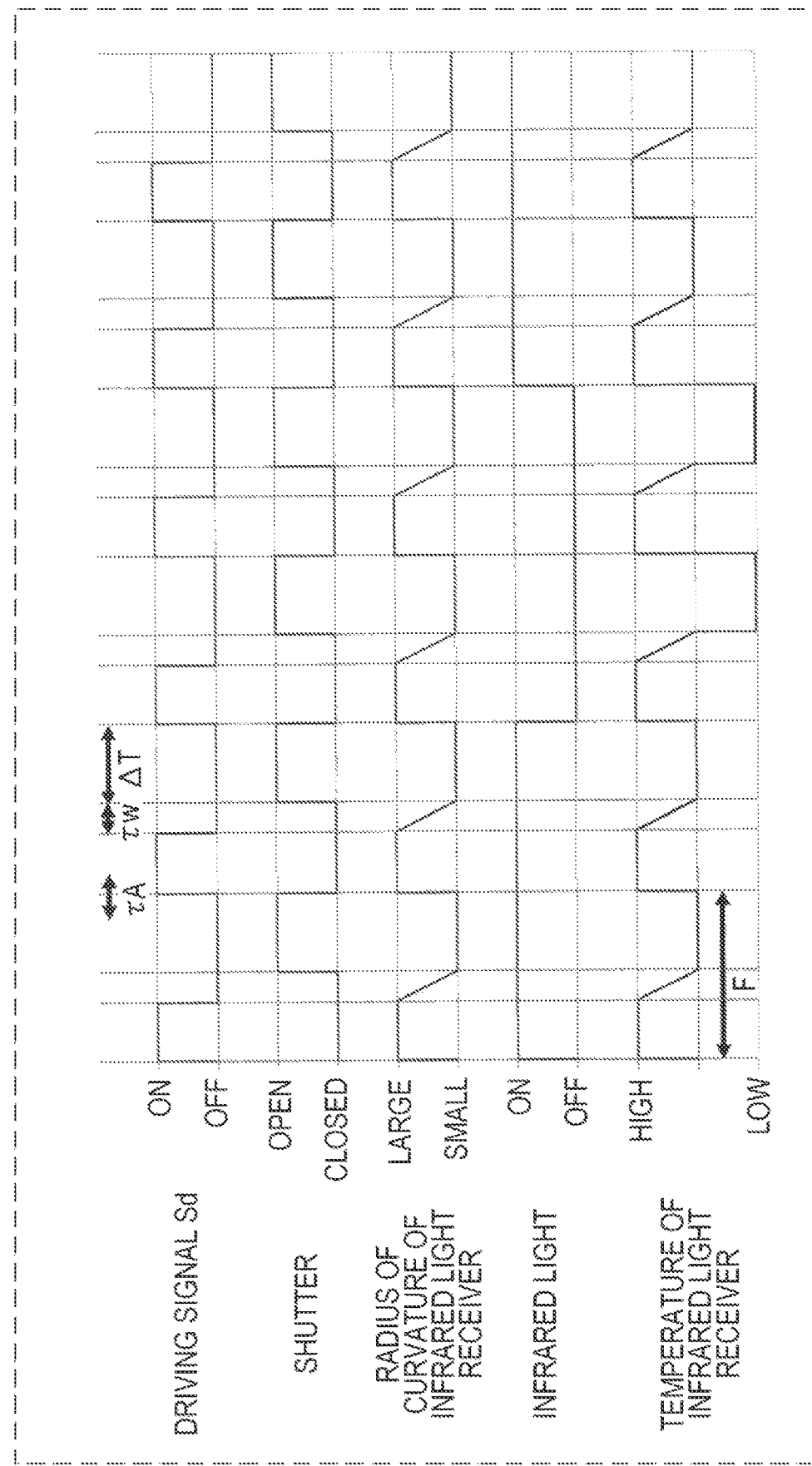

INFRARED SENSOR AND METHOD OF CONTROLLING INFRARED SENSOR

BACKGROUND

1. Technical Field

The present disclosure relates to an infrared sensor and a method of controlling an infrared sensor.

2. Description of the Related Art

In the related art, an infrared sensor having a phononic crystal structure is known, for example. For example, Japanese Unexamined Patent Application Publication No. 2017-223644 discloses an infrared sensor having an infrared light receiver, a base substrate, and a beam. The base substrate has a depressed part. The infrared light receiver and the base substrate are configured to be separated by the beam. The beam is formed from a thin-film phononic crystal in which through-holes are arranged periodically.

U.S. Patent Application No. 2017/0047499 discloses a phononic metamaterial structure. The structure is provided with a base material which is at least partially crystalline, and at least one irregular material. The base material may move phonons such that heat conduction occurs in the base material. The irregular material forms a pair with the base material and generates at least one vibration mode. With this arrangement, the irregular material interacts with the phonons that move inside the base material, slows down at least a partial group of the interacting phonons, and lowers the thermal conductivity of the base material.

U.S. Patent Application No. 2017/0069818 discloses a phononic structure. The phononic structure is provided with a sheet material. The sheet material has multiple regions. Adjacent regions in the sheet material have dissimilar phononic patterns. Holes may be formed in the regions.

A bolometric sensor is also known as an infrared sensor. For example, Japanese Unexamined Patent Application Publication No. 2019-105624 discloses an infrared sensor provided with a base substrate having a depressed part, a bolometric infrared light receiver, and a Peltier element. The Peltier element is sandwiched between the bolometric infrared light receiver and the depressed part of the base substrate. The bolometric infrared light receiver and the Peltier element are suspended above the base substrate by a beam provided with a phononic crystal structure having regularly arranged through-holes formed therein.

Japanese Unexamined Patent Application Publication (Translation of PCT Application) No. 2004-530909 discloses a microbolometer provided with a suspended portion including a radiation sensitive element. The suspended portion is configured by the superposition of a first region and a second region. The material forming the first region has a coefficient of thermal expansion that is sufficiently different from the material forming the second region. With this configuration, the suspended portion deforms to contact the substrate due to a temperature rise when the contacting regions reach a temperature TC lower than the breakdown temperature Td of the microbolometer.

SUMMARY

One non-limiting and exemplary embodiment provides a technology that is advantageous from the standpoint of raising the sensitivity to infrared light in an infrared sensor and increasing the number of times per second at which sensing can be performed.

In one general aspect, the techniques disclosed here feature an infrared sensor provided with an infrared light receiver, a signal pathway, and a first member, wherein the infrared light receiver has a structure in which at least two materials having different coefficients of thermal expansion are layered, the signal pathway includes a first signal pathway allowing passage of a driving signal to be applied to the infrared light receiver, the driving signal has a current value equal to or greater than a prescribed magnitude, and the infrared light receiver deforms in response to the application of the driving signal to the infrared light receiver, thereby at least a portion of the infrared light receiver contacting the first member.

The infrared sensor according to the present disclosure is advantageous from the standpoint of raising the sensitivity to infrared light in an infrared sensor and increasing the number of times per second at which sensing can be performed.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 is a timing chart illustrating a method of controlling the infrared sensor according to Embodiment 1;

Figure 1A:
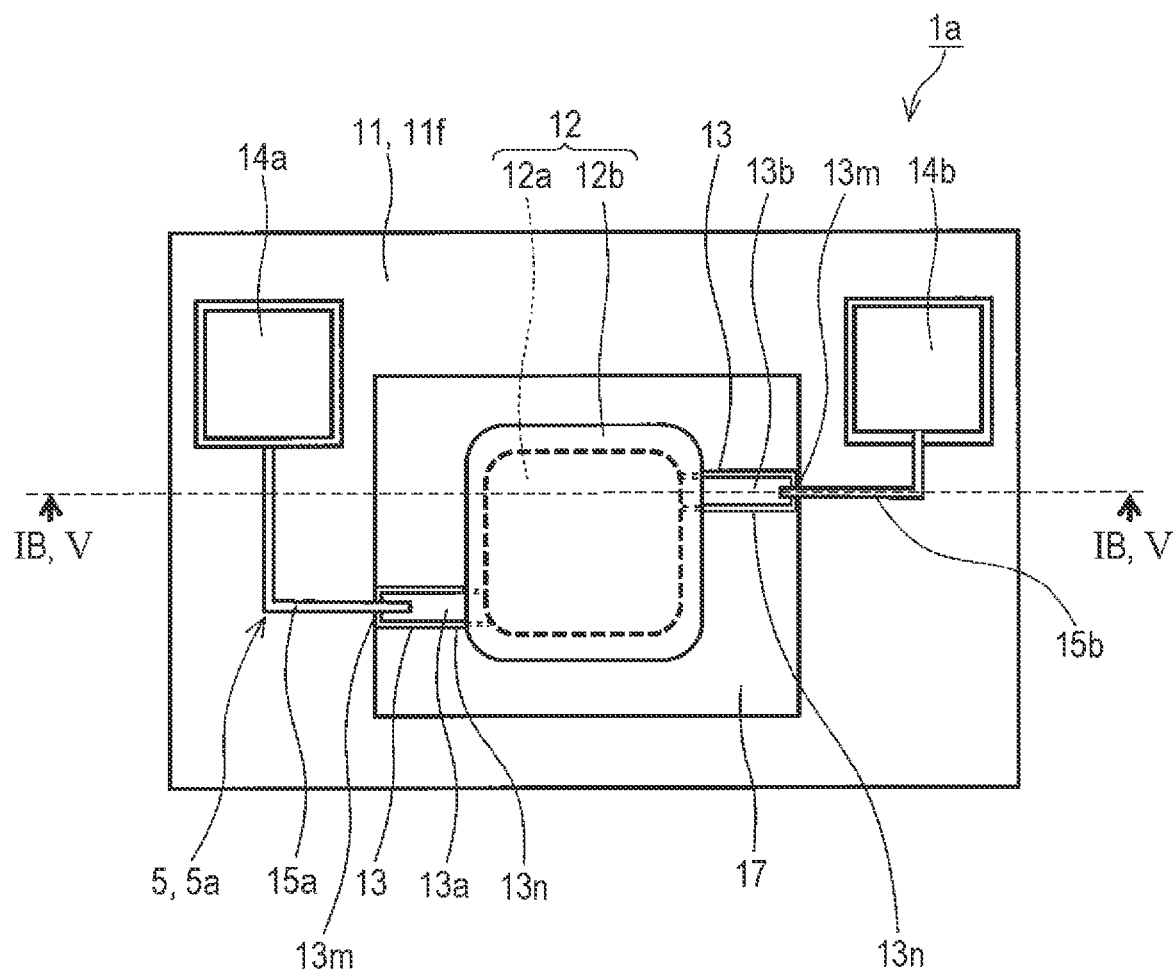
FIG. 1A is a plan view schematically illustrating an infrared sensor according to Embodiment 1.

DETAILED DESCRIPTIONS (Underlying Knowledge Forming Basis of the Present Disclosure)

Through investigation, the inventors came to understand that in the infrared sensor disclosed in Patent Literature 1, for example, the sensitivity to infrared light is improved further with higher thermal insulation performance of the beam. On the other hand, in such an infrared sensor, high thermal insulation performance of the beam is not considered to be advantageous from the standpoint of increasing the number of times per second at which sensing can be performed.

For example, the intensity of infrared light is measured by electrically sensing a physical state such as the temperature of the infrared light receiver in the sensing by the infrared sensor. After a signal is acquired from the sensing, the infrared light receiver is returned to the temperature from before the acquisition of the signal. In this way, it is necessary to regulate the temperature of the infrared light receiver in the infrared sensor every time sensing is performed, and the number of times per second at which sensing can be performed may be determined by the time it takes to regulate the temperature of the infrared light receiver. In an infrared sensor of the related art, if the thermal insulation performance of the beam is high, it tends to take longer to regulate the temperature of the infrared light receiver to the temperature from before the acquisition of a signal. For this reason, with regard to adjusting the thermal insulation performance of such abeam in the infrared sensor of the related art, there is a trade-off between raising the sensitivity to infrared light and increasing the number of time per second at which sensing can be performed. In this case, raising the thermal insulation performance of the beam reduces the number of times per second at which sensing can be performed. On the other hand, for example, if a beam is newly added to increase the number of times per second at which sensing can be performed, the effective thermal conductance is increased, the thermal insulation performance is lowered, and the sensitivity to infrared light is lowered.

Accordingly, the inventors thoroughly investigated technologies that could, after the acquisition of a signal for sensing a physical state of an infrared light receiver, shorten the time it takes to regulate the temperature of the infrared light receiver to the temperature from before the acquisition of a signal. As a result, the infrared sensor according to the present disclosure was ultimately completed.

EMBODIMENTS OF PRESENT DISCLOSURE

Hereinafter, embodiments of the present disclosure will be described with reference to the drawings. Note that the embodiments described hereinafter all illustrate general or specific examples. Features such as numerical values, shapes, materials, structural elements, layout positions and connection states of structural elements, process conditions, steps, and the ordering of steps indicated in the following embodiments are merely examples, and are not intended to limit the present disclosure. Among the structural elements in the following embodiments, structural elements that are not described in the independent claim indicating the broadest concept are described as arbitrary or optional structural elements. Note that each diagram is a schematic diagram, and does not necessarily illustrate a strict representation.

Embodiment 1

Figure 1B:
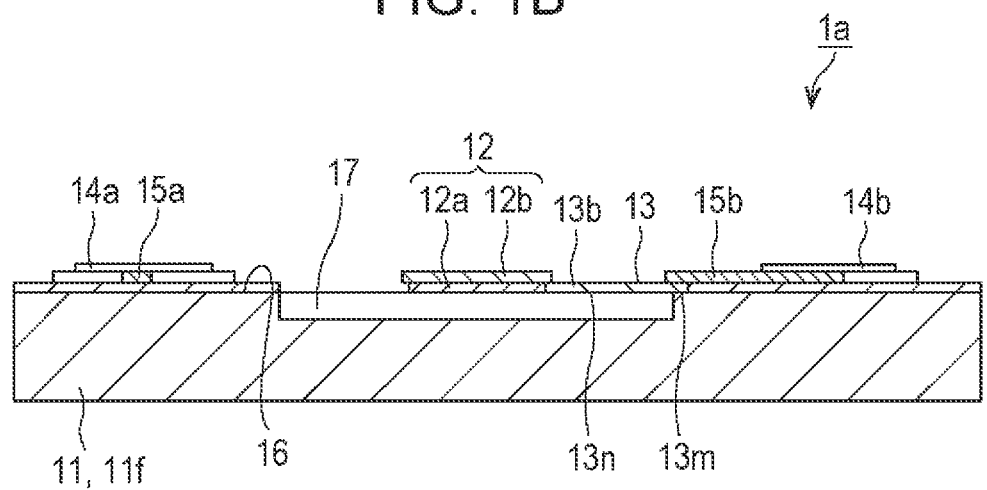
FIG. 1B is a cross section of the infrared sensor taken along the cutting plane line IB-IB in FIG. 1A.
Figure 2A:
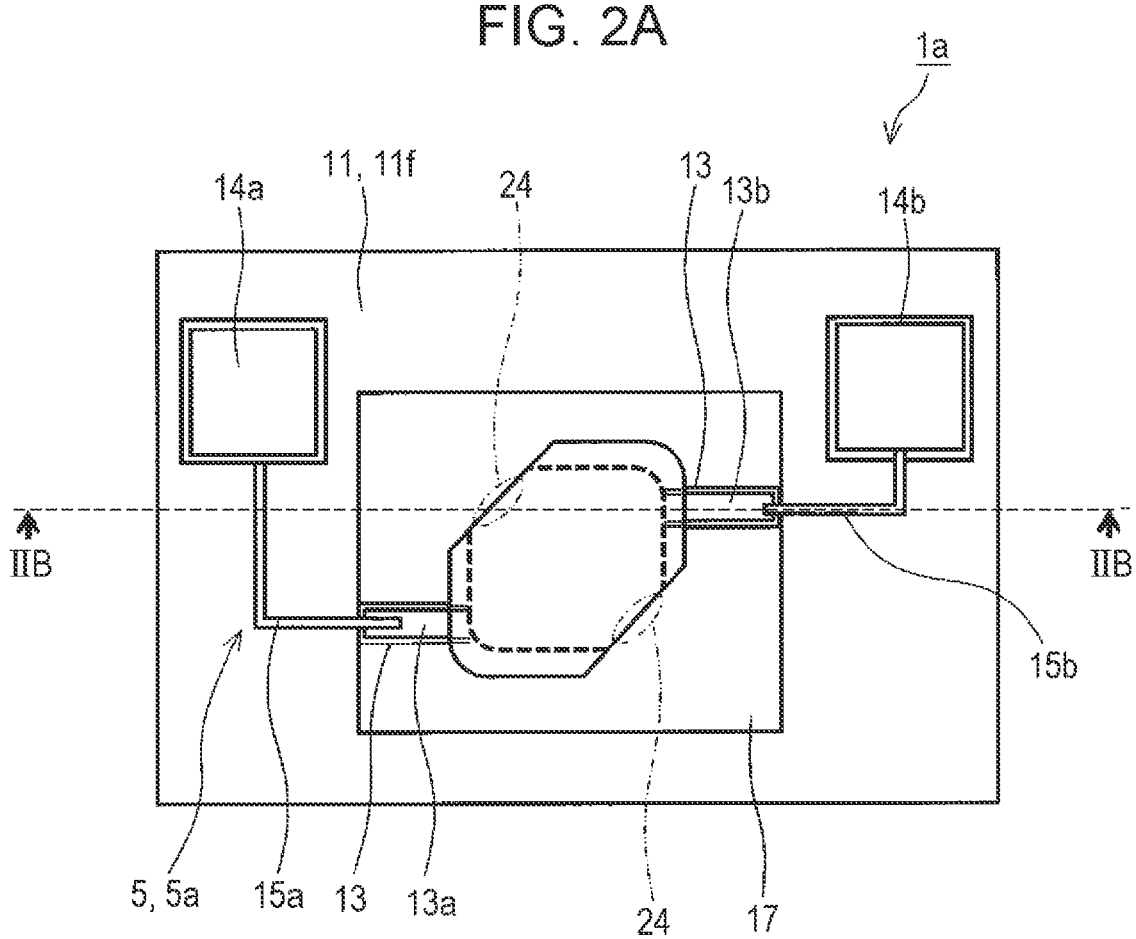
FIG. 2A is a plan view schematically illustrating the infrared sensor according to Embodiment 1 when a driving signal is applied to the infrared sensor.
Figure 2B:
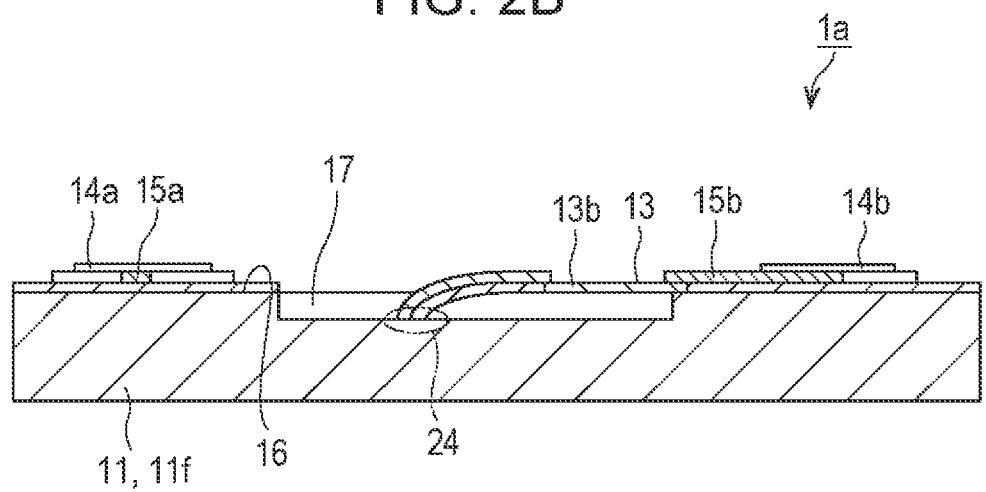
FIG. 2B is a cross section of the infrared sensor taken along the cutting plane line IIB-IIB in FIG. 2A.

FIGS. 1A and 1B illustrate an infrared sensor 1a according to Embodiment 1. FIG. 1B is a cross section of the infrared sensor 1a taken along the cutting plane line IB-IB illustrated in FIG. 1A. The infrared sensor 1a is provided with an infrared light receiver 12, a signal pathway 5, and a first member 11f. The infrared light receiver 12 has a structure in which at least two types of materials having different coefficients of thermal expansion are layered. The signal pathway 5 includes a first signal pathway 5a. The first signal pathway 5a is a signal pathway for allowing the passage of a driving signal Sd to apply the driving signal Sd to the infrared light receiver 12. The infrared light receiver 12 deforms in response to the application of the driving signal Sd having a current value Is equal to or greater than prescribed magnitude. FIGS. 2A and 2B illustrate the infrared sensor 1a when the driving signal Sd having the current value Is is applied to the infrared sensor 1a. As illustrated in FIGS. 2A and 2B, at least a portion of the infrared light receiver 12 contacts the first member 11f. At this time, the infrared light receiver 12 deforms by a prescribed radius of curvature, for example. The radius of curvature is set such that at least a portion of the infrared light receiver 12 contacts the first member 11f. Note that the radius of curvature is the reciprocal of the curvature.

Stopping the application of the driving signal Sd causes the infrared light receiver 12 to separate from the first member 11f. In this way, by regulating the application of the driving signal Sd, it is possible to switch between a state in which at least a portion of the infrared light receiver 12 touches the first member 11f and a state in which the infrared light receiver 12 is away from the first member 11f.

The infrared light receiver 12 is a thermopile infrared light receiver, for example. The infrared light receiver 12 is provided with a first layer 12a and a second layer 12b, for example. The first layer 12a is formed from a first material. The second layer 12b is formed from a second material having a coefficient of thermal expansion that is different from the coefficient of thermal expansion of the first material. The first layer 12a and the second layer 12b are layered, by which the infrared light receiver 12 has a layered structure of at least two layers having different coefficients of thermal expansion. In the infrared sensor 1a, the second material forming the second layer 12b is electrically conductive, for example. The electrical resistivity of the second material is not limited to a specific value and may be less than or equal to 1 Ωcm, for example. The electrical resistivity of the second material is equal to or greater than $1\times10^{-4}$ Ωcm, for example. The difference between the coefficient of thermal expansion of the first material forming the first layer 12a and the coefficient of thermal expansion of the second material forming the second layer 12b is not limited to a specific value. The difference is equal to or greater than $1\times10^{-6}$/K, for example. The difference is less than or equal to $1\times10^{-4}$/K, for example. In this specification, the electrical resistivity and the coefficient of thermal expansion mean the values at 25° C.

The first material is not limited to a specific material and is a silicon semiconductor, for example. The silicon semiconductor is Si or SiGe, for example. The second material is not limited to a specific material and is Al or TiN, for example. However, the infrared light receiver 12 is not limited to the above examples.

As illustrated in FIGS. 1A and 1B, the infrared sensor 1a is further provided with a substrate 11 and a beam 13, for example. The beam 13 has a connected part 13m and an isolated part 13n. The connected part 13m is connected to the substrate 11, for example. The connected part 13m and the substrate 11 may be in direct contact. The connected part 13m is connected to an upper surface 16 of the substrate 11, for example. The isolated part 13n is isolated from the substrate 11. The isolated part 13n and the substrate 11 do not have to be in direct contact, and the isolated part 13n may be in contact with the substrate 11 through the connected part 13m. The infrared light receiver 12 is joined to the isolated part 13n and supported in an isolated state from the substrate 11, for example. "A is isolated from B" may be interpreted as meaning that "A and B are not in direct contact".

The beam 13 is configured as a two-handed beam, for example. The beam 13 has a pair of connected parts 13m and a pair of isolated parts 13n, for example. The infrared light receiver 12 is joined to the ends of the pair of isolated parts 13n, for example. The infrared light receiver 12 is disposed between the isolated parts 13n. In other words, the infrared light receiver 12 is disposed near the center of the beam 13.

As illustrated in FIG. 1A, the infrared sensor 1a is further provided with a first signal processing circuit 14a, a second signal processing circuit 14b, a first interconnect 15a, and the second interconnect 15b, for example. The first signal processing circuit 14a, second signal processing circuit 14b, first interconnect 15a, and second interconnect 15b are disposed on the upper surface 16 of the substrate 11, for example. The first signal pathway 5a is configured by the first interconnect 15a, the second interconnect 15b, the beam 13, and the hot junction of a thermocouple, for example.

The material forming each of the first interconnect 15a and the second interconnect 15b is not particularly limited and may be a semiconductor, a metal material, or a metallic compound, for example. The semiconductor is doped with a prescribed dopant, for example. The metal material is a material with a low thermal conductivity such as Ti, for example. The metallic compound is a material with a low thermal conductivity such as TiN.

The first signal processing circuit 14a and the second signal processing circuit 14b may each have a known configuration capable of processing electrical signals.

In the infrared sensor 1a, the first member 11f is the substrate 11, for example. Consequently, as illustrated in FIGS. 2A and 2B, when the driving signal Sd having the current value Is is applied to the infrared sensor 1a, at least a portion of the infrared light receiver 12 contacts the substrate 11.

Typically, the substrate 11 is formed from a semiconductor. The semiconductor forming the substrate 11 is Si, for example. An oxide film may also be formed on the substrate 11. In this case, the upper surface 16 of the substrate 11 may be formed by the oxide film. The oxide film is an $SiO_2$ film, for example. However, the configuration of the substrate 11 is not limited to such an example.

As illustrated in FIG. 1B, the beam 13 has a single-layer structure, for example. The beam 13 has a first region 13a and the second region 13b, for example. The first region 13a has a first Seebeck coefficient and the second region 13b has a second Seebeck coefficient different from the first Seebeck coefficient. The second layer 12b is electrically connected to the first region 13a and the second region 13b. In this way, a thermocouple is formed by the first region 13a and the second region 13b electrically connected by the second layer 12b, and the infrared light receiver 12. The difference between the first Seebeck coefficient and the second Seebeck coefficient is not limited to a specific value, for example. The difference is equal to or greater than 10 μV/K, for example. The difference is less than or equal to 1 mV/K, for example. Note that in this specification, the Seebeck coefficient means the value at 25° C.

Each of the material forming the first region 13a and the material forming the second region 13b is not limited to a specific material and is a semiconductor, for example. In a semiconductor, heat is transferred primarily by phonons. On the other hand, in a metal, heat is transferred primarily by free electrons rather than by phonons. The semiconductor may be a single-element semiconductor such as Si or Ge, or a compound semiconductor such as SiN, SiC, SiGe, GaAs, InAs, InSb, InP, GaN, or AlN, for example. The semiconductor may also be an oxide semiconductor such as $Fe_2O_3$, $VO_2$, $TiO_2$, or $SrTiO_3$. Each of the material forming the first region 13a and the material forming the second region 13b is not limited to the above examples. The material forming the first region 13a and the material forming the second region 13b ordinarily have mutually different compositions. On the other hand, in the case where the material forming the first region 13a and the material forming the second region 13b are both semiconductors, a material having the same basic composition but conductivity types of different polarity may be used. The conductivity type of a semiconductor can be adjusted by a known technique such as doping. For example, the material forming the first region 13a may be a p-type semiconductor, and the material forming the second region 13b may be an n-type semiconductor. In this case, the first region 13a is a p-type region and the second region 13b is an n-type region.

Each of the material forming the first region 13a and the material forming the second region 13b may be a monocrystalline material in which the orderliness of the atomic arrangement is maintained over a long range, a polycrystalline material, or an amorphous material.

The beam 13 may have a single-layer structure of mono-Si, and each of the first region 13a and the second region 13b may be formed by doping the mono-Si with a prescribed dopant. Technologies for working mono-Si are well established, and therefore this example is excellent from the standpoint of the ease of manufacturing of the infrared sensor 1a.

The first interconnect 15a is electrically connected to the first region 13a, for example. The first interconnect 15a is electrically connected to the first signal processing circuit 14a, for example. With this arrangement, the first region 13a and the first signal processing circuit 14a are electrically connected. The second interconnect 15b is electrically connected to the second region 13b, for example. The second interconnect 15b is electrically connected to the second signal processing circuit 14b, for example. With this arrangement, the second region 13b and the second signal processing circuit 14b are electrically connected. The first signal processing circuit 14a and the second signal processing circuit 14b are mutually independent circuits, for example. The first signal processing circuit 14a and the second signal processing circuit 14b may also be unified.

As described above, in the infrared sensor 1a, the first interconnect 15a, the second interconnect 15b, the beam 13, the first region 13a, and the second region 13b are electrically connected to form a single pathway, for example. In this way, the first signal pathway 5a is formed.

As illustrated in FIGS. 1A and 1B, the substrate 11 has a recess 17, for example. The recess 17 is formed between the substrate 11 and the assemblage of the infrared light receiver 12 and the beam 13. The assemblage of the infrared light receiver 12 and the beam 13 is suspended above the recess 17.

As illustrated in FIG. 1A, in a plan view, the area of the recess 17 is greater than the area of the infrared light receiver 12. Furthermore, in a plan view, the infrared light receiver 12 is surrounded by the perimeter of the recess 17. The recess 17 has an opening, and the opening is surrounded by the upper surface 16. Note that in this specification, a "plan view" means viewing an object from the direction perpendicular to the principal surface of the object. The "principal surface" means the surface of the object that has the greatest area.

When infrared light is incident on the infrared light receiver 12, the temperature of the infrared light receiver 12 rises compared to when infrared light is not incident on the infrared light receiver 12. At this time, the more the infrared light receiver 12 is thermally insulated from the substrate 11 and the members on the substrate 11 which may function as a heat bath, the smaller is the thermal conductance between the infrared light receiver 12 and its surroundings. With this arrangement, the temperature of the infrared light receiver 12 rises more easily. In the infrared sensor 1a, the incidence of infrared light on the infrared light receiver 12 causes the temperature of the thermocouple formed by the first region 13a, the second region 13b, and the infrared light receiver 12 to rise compared to when infrared light is not incident on the infrared light receiver 12. Consequently, an electromotive force is produced due to the Seebeck effect in the thermocouple, and a signal generated by the electromotive force is processed by the first signal processing circuit 14a and the second signal processing circuit 14b. With this arrangement, infrared light is sensed by the infrared sensor 1a. By processing the signal generated by the electromotive force, it is possible to measure at least one of the intensity of the infrared light or the temperature of an object with the infrared sensor 1a.

For example, if the driving signal Sd is applied from the first signal processing circuit 14a through the first signal pathway 5a, and a current with the current value Is flows along the first signal pathway 5a, the first signal pathway 5a is heated by Joule heating. Since the first interconnect 15a, the second interconnect 15b, and the beam 13 contact the substrate 11, the substrate 11 functions as a heat bath that keeps the temperature of these components at substantially the same temperature as the temperature of the substrate 11. On the other hand, the infrared light receiver 12 is isolated from the substrate 11 and is therefore heated by Joule heating, and the temperature of the infrared light receiver 12 rises. The infrared light receiver 12 includes the first layer 12a and the second layer 12b, for example, and the first layer 12a and second layer 12b are respectively formed from first and second materials having different coefficients of thermal expansion. For this reason, the infrared light receiver 12 bends due to the difference between the coefficient of thermal expansion of the first material and the coefficient of thermal expansion of the second material. With this arrangement, the infrared light receiver 12 deforms to have a smaller radius of curvature.

The amount of temperature change in the infrared light receiver 12 in the case where the radius of curvature of the infrared light receiver 12 changes due to the difference between the coefficient of thermal expansion of the first material and the coefficient of thermal expansion of the second material is greater than the amount of temperature change in the infrared light receiver 12 associated with the absorption of infrared light. By configuring the infrared sensor 1a as described above, if a current value Is equal to or greater than a prescribed magnitude flows along the first signal pathway 5a, a portion of the infrared light receiver 12 can be made to contact a member isolated from the infrared light receiver 12, such as the substrate 11. The magnitude of the current value Is is fixed so that a portion of the infrared light receiver 12 can contact the first member 11f.

An example of a method of controlling the infrared sensor 1a will be described. FIG. 3 is a timing chart related to a method of controlling the infrared sensor 1a. For example, sensing is performed a prescribed number of times per second by the infrared sensor 1a. The driving signal Sd that regulates the radius of curvature of the infrared light receiver 12 is applied to the infrared light receiver 12 on a cycle equal to the sensing cycle of the infrared sensor 1a. In a period for sensing infrared light with the infrared sensor 1a, the application of the driving signal Sd is regulated to maximize the radius of curvature of the infrared light receiver 12. In other words, the curvature of the infrared light receiver 12 is minimized in this period.

A single sensing by the infrared sensor 1a includes a first step, a second step, and a third step, for example.

Figure 4A:
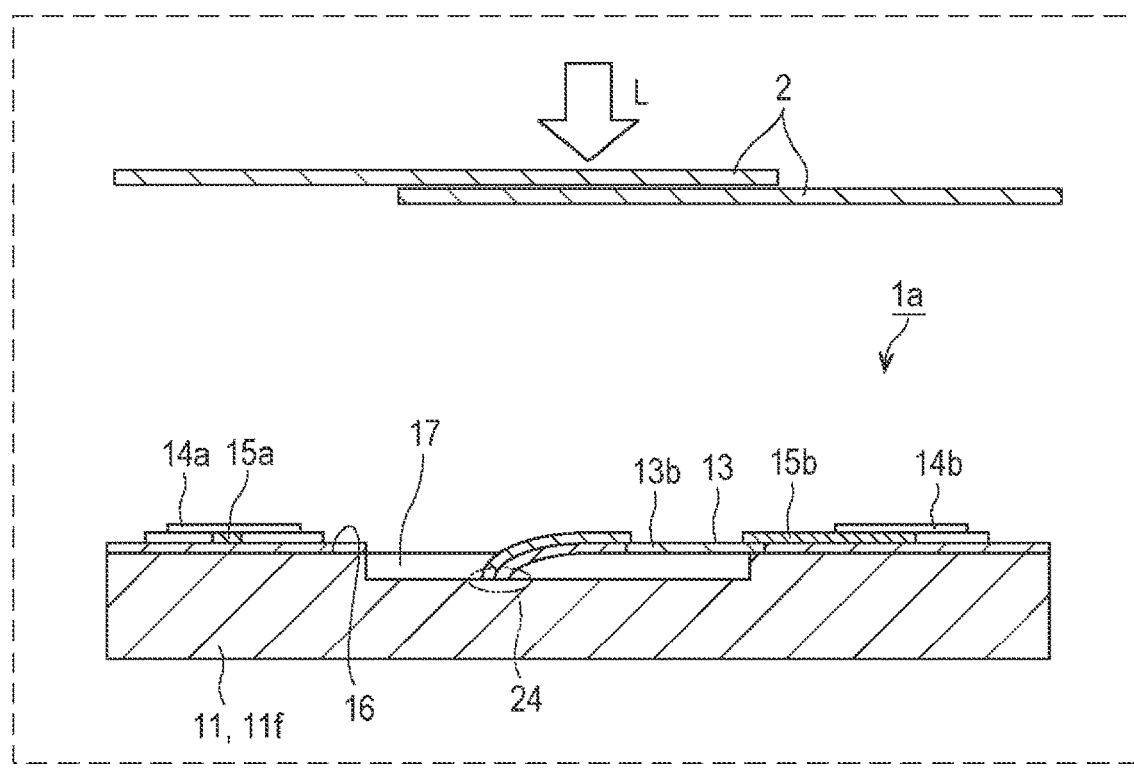
FIG. 4A is a cross section illustrating the state of an infrared sensor in a first step.

FIG. 4A illustrates a cross section of the infrared sensor 1a in the first step. In this step, the driving signal Sd having the current value Is is applied to the infrared light receiver 12. At this time, the radius of curvature of the infrared light receiver 12 decreases, and the infrared light receiver 12 contacts the substrate 11 to form a contact portion 24. For this reason, the thermal relaxation time $\tau A$ it takes until the temperature of the infrared light receiver 12 stabilizes to a steady state is shorter than a thermal relaxation time $\tau I$. The thermal relaxation time $\tau I$ is the time it takes, in an infrared sensor of the related art, until the temperature of the infrared light receiver stabilizes to a steady state while the infrared light receiver remains apart from the substrate, without changing the radius of curvature of the infrared light receiver. A shutter 2 is disposed above the infrared sensor 1a, for example. In the first step, the shutter 2 is closed, and the infrared light receiver 12 is not irradiated by infrared light L. The shutter 2 may also be a mechanical shutter that blocks infrared light with a separate mechanism.

Figure 4B:
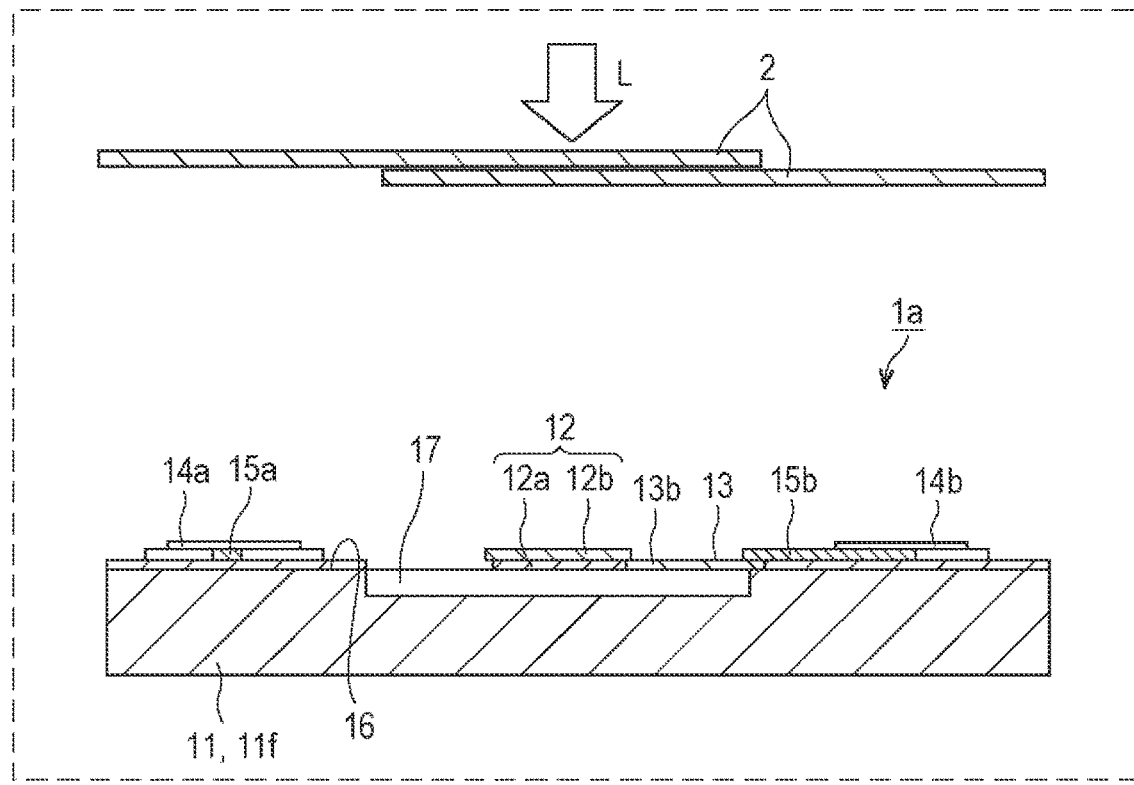
FIG. 4B is a cross section illustrating the state of an infrared sensor in a second step.

FIG. 4B illustrates a cross section of the infrared sensor 1a in the second step. In the second step, the driving signal Sd is not applied to the infrared light receiver 12. For this reason, Joule heating associated with the application of the driving signal Sd does not occur, and therefore the temperature of the infrared light receiver 12 falls. Accordingly, the radius of curvature of the infrared light receiver 12 increases, and the curvature of the infrared light receiver 12 decreases. If a time τw it takes for the radius of curvature of the infrared light receiver 12 to increase sufficiently elapses, the infrared light receiver 12 separates from the substrate 11 completely. In the infrared sensor 1a, the time τw may be short in order to increase the number of times per second at which sensing can be performed. The time τw is shorter than the thermal relaxation time τI, for example. In the second step, the shutter 2 is closed. For this reason, the infrared light receiver 12 is not irradiated by the infrared light L.

Figure 4C:
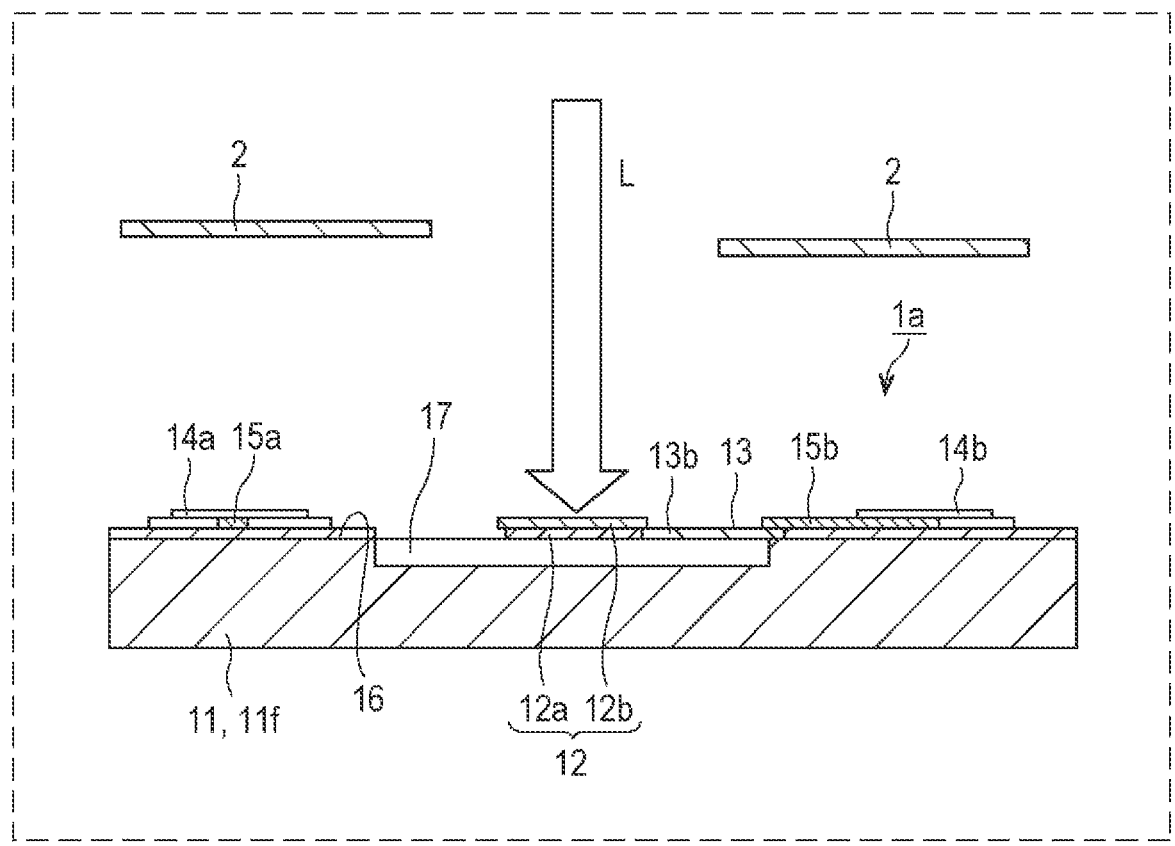
FIG. 4C is a cross section illustrating the state of an infrared sensor in a third step.

FIG. 4C illustrates a cross section of the infrared sensor 1a in the third step. In the third step, the driving signal Sd is not applied to the infrared light receiver 12. On the other hand, the infrared light receiver 12 is irradiated by the infrared light L. Accordingly, the infrared light L is sensed in the third step. In the third step, the infrared light receiver 12 absorbs the infrared light L, which causes the temperature of the infrared light receiver 12 to rise above the temperature of the infrared light receiver 12 in the second step. Consequently, by using the signal pathway 5, the first signal processing circuit 14a, and the second signal processing circuit 14b to sense the thermo-electromotive force associated with this temperature rise, the intensity of the infrared light L incident on the infrared light receiver 12 can be measured, for example.

After the third step ends, the flow returns to the first step. In the first step, the driving signal Sd having the current value Is is applied to the infrared light receiver 12 again, and Joule heating occurs in the first signal pathway 5a. The increase in the temperature of the infrared light receiver 12 due to the application of the driving signal Sd is greater than the increase in temperature due to the absorption of the infrared light L. Accordingly, when the flow proceeds from the third step to the first step, the temperature of the infrared light receiver 12 rises. As described above, if the driving signal Sd having the current value is is applied to the infrared light receiver 12, the infrared light receiver 12 contacts the substrate 11 and the temperature of the infrared light receiver 12 reaches a steady state in the thermal relaxation time ZcA. This completes the preparations for the next sensing.

According to the infrared sensor 1a, the time F it takes to perform a single sensing is determined by the sum of the thermal relaxation time τA, the time τw, and the time ΔT for receiving the infrared light L. On the other hand, according to an infrared sensor of the related art, the time it takes to perform a single sensing is determined by the sum of the thermal relaxation time τI and the time ΔT. According to the infrared sensor 1a, even if the thermal insulation performance around the infrared light receiver 12 is high, it is easy to make the sum of the thermal relaxation time τA and the time τw sufficiently small compared to the thermal relaxation time τI, and the number of times per second at which sensing can be performed is easily increased. For example, in the case of using the infrared sensor 1a to capture images, the frame rate of the image capture is easily increased.

In the method of controlling the infrared sensor 1a, the temperature of the infrared light receiver 12 when the infrared light receiver 12 is receiving infrared light is lower than the temperature of the infrared light receiver 12 when the driving signal Sd is being applied to the infrared light receiver 12, for example. The temperature of the infrared light receiver 12 when the infrared light receiver 12 is receiving infrared light may also be equal to or greater than the temperature of the infrared light receiver 12 when the driving signal Sd is being applied to the infrared light receiver 12.

As illustrated in FIG. 1A, the infrared light receiver 12 has a quadrilateral shape in a plan view, for example. In this case, multiple infrared light receivers 12 can be arranged densely when arranging the infrared light receivers 12 in a matrix array. As illustrated in FIG. 1A, in the case where the quadrilateral infrared light receiver 12 is supported by a pair of isolated parts 13n, the junctions between the infrared light receiver 12 and each of the isolated parts 13n may be formed at positions offset from each other in a direction parallel to a side of the infrared light receiver 12 in a plan view. In this case, the amount of bending of the infrared light receiver 12 associated with a temperature change is increased easily, and the strength of the driving signal Sd for achieving contact between the infrared light receiver 12 and the first member 11f can be reduced. As a result, the energy consumption of the infrared sensor 1a can be reduced.

In the case where the quadrilateral infrared light receiver 12 is supported by a pair of isolated parts 13n, the junctions between the infrared light receiver 12 and each of the isolated parts 13n may also be formed on the same line parallel to a side of the infrared light receiver 12 in a plan view. In this case, the area of the contact portion 24 when the infrared light receiver 12 and the first member 11f contact is increase easily. The infrared light receiver 12 may also be a shape other than a quadrilateral shape in a plan view.

As illustrated in FIG. 2B, when the driving signal Sd is applied, the infrared light receiver 12 deforms to have a smaller radius of curvature and contacts the substrate 11. In this way, the infrared light receiver 12 deforms toward the substrate 11 when the driving signal Sd is applied. On the other hand, the infrared light receiver 12 may also deform away from the substrate 11 when the driving signal Sd is applied. In this case, the first member 11f is disposed above the infrared light receiver 12. The first member 11f is a film that may function as a heat bath, for example. With such a configuration, the number of times per second at which sensing can be performed in the infrared sensor 1a is likewise increased easily.

An example of a method of manufacturing the infrared sensor 1a will be described. FIGS. 5A, 5B, 5C, and 5D are cross sections taken along cutting plane lines corresponding to the cutting plane line IB-IB in FIG. 1A in one example of a method of manufacturing the infrared sensor 1a. A method of manufacturing the infrared sensor 1a is not limited to the method below.

Figure 5A:
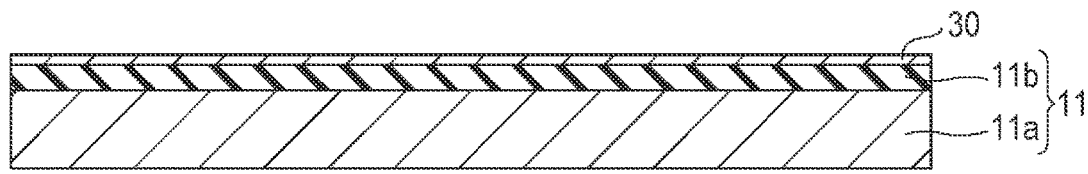
FIG. 5A is a cross section illustrating an example of a method of manufacturing the infrared sensor according to Embodiment 1.

As illustrated in FIG. 5A, first, an insulating film 11b formed from $SiO_2$ is formed by thermal oxidation on the upper surface of a silicon substrate 11a. In this way, the substrate 11 is obtained. Next, a beam layer 30 is formed on the upper surface of the insulating film 11b. The beam layer 30 can be formed by a known method of forming a thin film, such as chemical vapor deposition (CVD), for example. A material that can be used to form the beam 13, the first region 13a, and the second region 13b is selected as the material forming the beam layer 30, for example. The material forming the beam layer 30 is a material that is changed into the first region 13a and the second region 13b through doping, for example. A material that can be further used to form the first layer 12a of the infrared light receiver 12 may also be selected as the material forming the beam layer 30. The thickness of the beam layer 30 is not limited to a specific value and may be equal to or greater than 10 nm and less than or equal to 500 nm, for example.

Figure 5B:
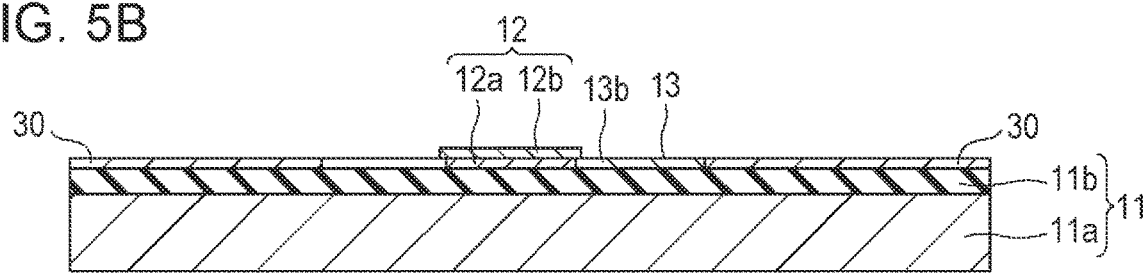
FIG. 5B is a cross section illustrating an example of a method of manufacturing the infrared sensor according to Embodiment 1.

Next, as illustrated in FIG. 5B, a location corresponding to the beam 13 in the beam layer 30 is doped with a prescribed dopant to form the first region 13a (not illustrated) and the second region 13b. The portion that changes into the first region 13a is doped into p-type, for example, and the portion that changes into the second region 13b is doped into n-type, for example. Thereafter, the shape of the beam 13 is obtained by performing lithography and selectively etching the beam layer 30. At this time, for the first interconnect 15a and the second interconnect 15b to be formed later, the shape of the beam 13 may be formed such that the doped first region 13a and second region 13b extend past the portion corresponding to the recess 17 in the substrate 11 in a plan view. Next, the second material is deposited in a location corresponding to the infrared light receiver 12 to form the second layer 12b.

Figure 5C:
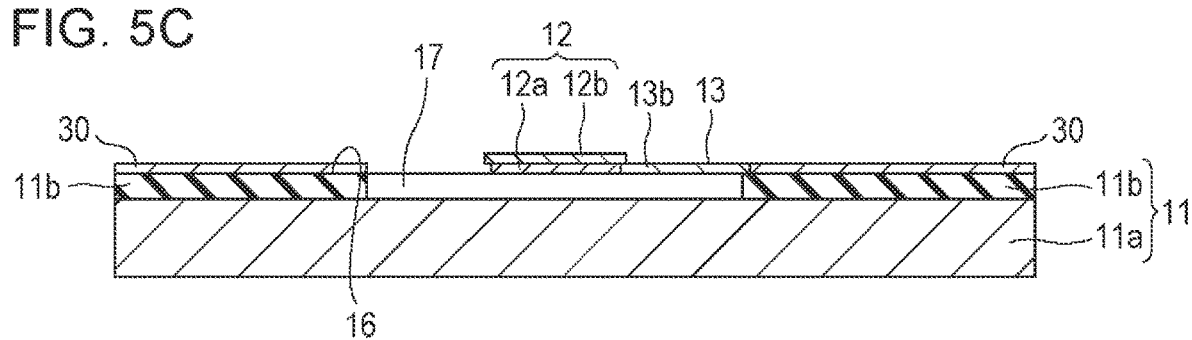
FIG. 5C is a cross section illustrating an example of a method of manufacturing the infrared sensor according to Embodiment 1.

Next, as illustrated in FIG. 5C, the insulating film 11b is selectively etched to form the beam 13 and the recess 17. Through the formation of the recess 17, the portion of the beam layer 30 that is changed into the shape illustrated in FIG. 5B is at least partially isolated from the substrate 11.

Figure 5D:
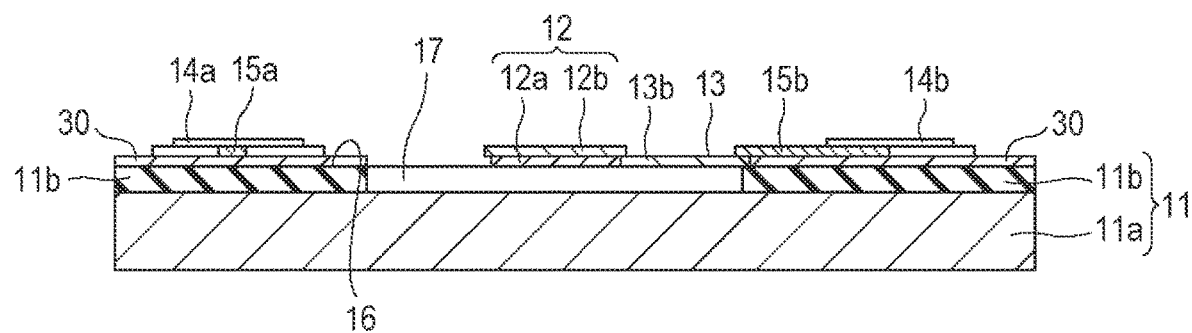
FIG. 5D is a cross section illustrating an example of a method of manufacturing the infrared sensor according to Embodiment 1.

Next, as illustrated in FIG. 5D, the first interconnect 15a and the second interconnect 15b electrically connected to the first region 13a and the second region 13b, respectively, are formed. The first interconnect 15a and the second interconnect 15b can be formed by photolithography and sputtering, for example. Next, the first signal processing circuit 14a and the second signal processing circuit 14b are formed on the substrate 11. Additionally, processing for making necessary electrical connections is performed, and the infrared sensor 1a is obtained. The infrared light receiver 12, the first signal processing circuit 14a, and the second signal processing circuit 14b can be formed by known methods.

In principle, the infrared sensor 1a functions as a stand-alone infrared sensor. However, multiple infrared sensors 1a may also be arranged on the substrate 11 to form an array structure in which each infrared sensor 1a corresponds to a single pixel. According to such an array structure, it is possible to perform at least one process selected from the group consisting of imaging of an object having a temperature less than or equal to an upper-limit value, evaluation of infrared radiation, and evaluation of an intensity distribution of a laser beam.

Embodiment 2

Figure 6A:
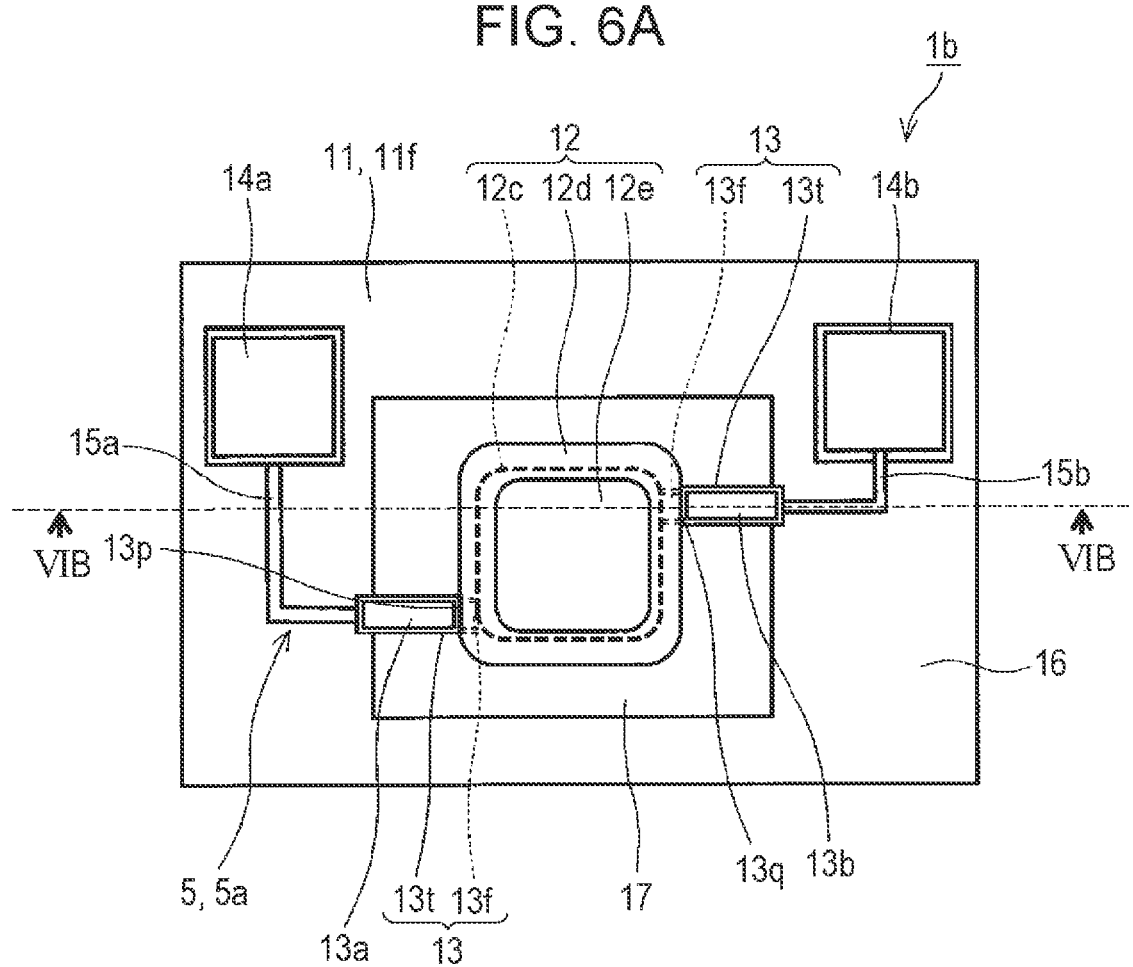
FIG. 6A is a plan view schematically illustrating an infrared sensor according to Embodiment 2.
Figure 6B:
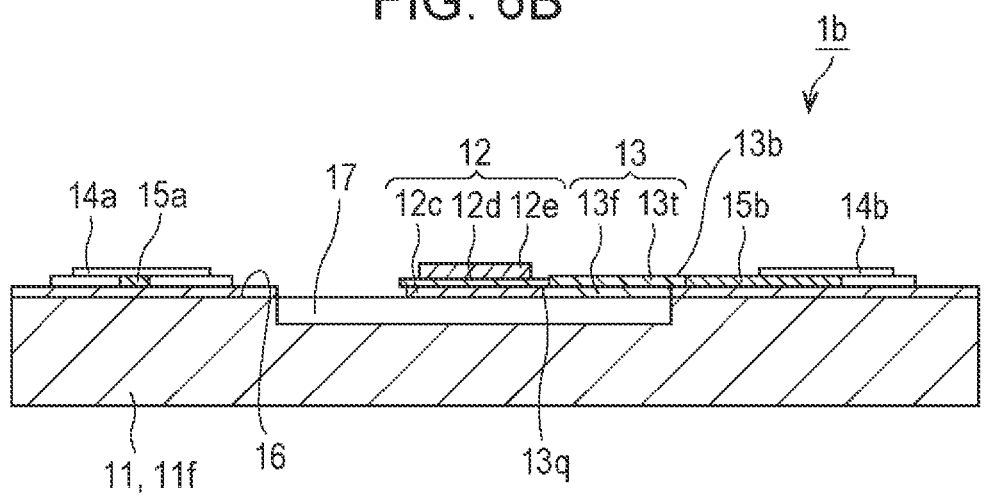
FIG. 6B is a cross section of the infrared sensor taken along the cutting plane line VIB-VIB in FIG. 6A.

FIGS. 6A and 6B illustrate an infrared sensor 1b according to Embodiment 2. FIG. 6B is a cross section of the infrared sensor 1b taken along the cutting plane line VIB-VIB illustrated in FIG. 6A. The infrared sensor 1b is configured similarly to the infrared sensor 1a, except for the portions specifically described otherwise. Components of the infrared sensor 1b which are identical or corresponding to the components of the infrared sensor 1a are denoted with the same signs, and a detailed description is omitted. The description regarding the infrared sensor 1a also applies to the infrared sensor 1b unless the result would be technically inconsistent.

The infrared sensor 1b is a thermopile infrared sensor, for example. Consequently, in the infrared sensor 1b, the infrared light receiver 12 is a thermopile infrared light receiver, for example.

In the infrared sensor 1b, the beam 13 includes a base layer 13f and the thermocouple material layer 13t. The thermocouple material layer 13t includes a first region 13a and the second region 13b. The second region 13b is formed from a material having a Seebeck coefficient that is different from the Seebeck coefficient of the material forming the first region 13a.

In the infrared sensor 1b, the infrared light receiver 12 is provided with a first layer 12c, a second layer 12d, and a third layer 12e. The second layer 12d is electrically conductive. The first region 13a and the second layer 12d are joined to each other in a junction region 13p. The second region 13b and the second layer 12d are joined to each other in a junction region 13q. A thermocouple is formed by the first region 13a, the second region 13b, and the second layer 12d joined to each other by the junction region 13p and the junction region 13q.

In the infrared sensor 1b, amorphous SiN, for example, can be used as the material forming the base layer 13f and the first layer 12c. Amorphous SiN has a low thermal conductivity. For this reason, the thermal insulation performance around the infrared light receiver 12 is increased easily, and the sensitivity to infrared light is increased easily. In the infrared sensor 1b, the second layer 12d acts as the hot junction of the thermocouple, and the third layer 12e acts as an infrared absorption layer.

The infrared sensor 1b works on the same operating principle as the infrared sensor 1a. The infrared sensor 1b can be manufacturing by applying the method of manufacturing the infrared sensor 1a.

Embodiment 3

Figure 7A:
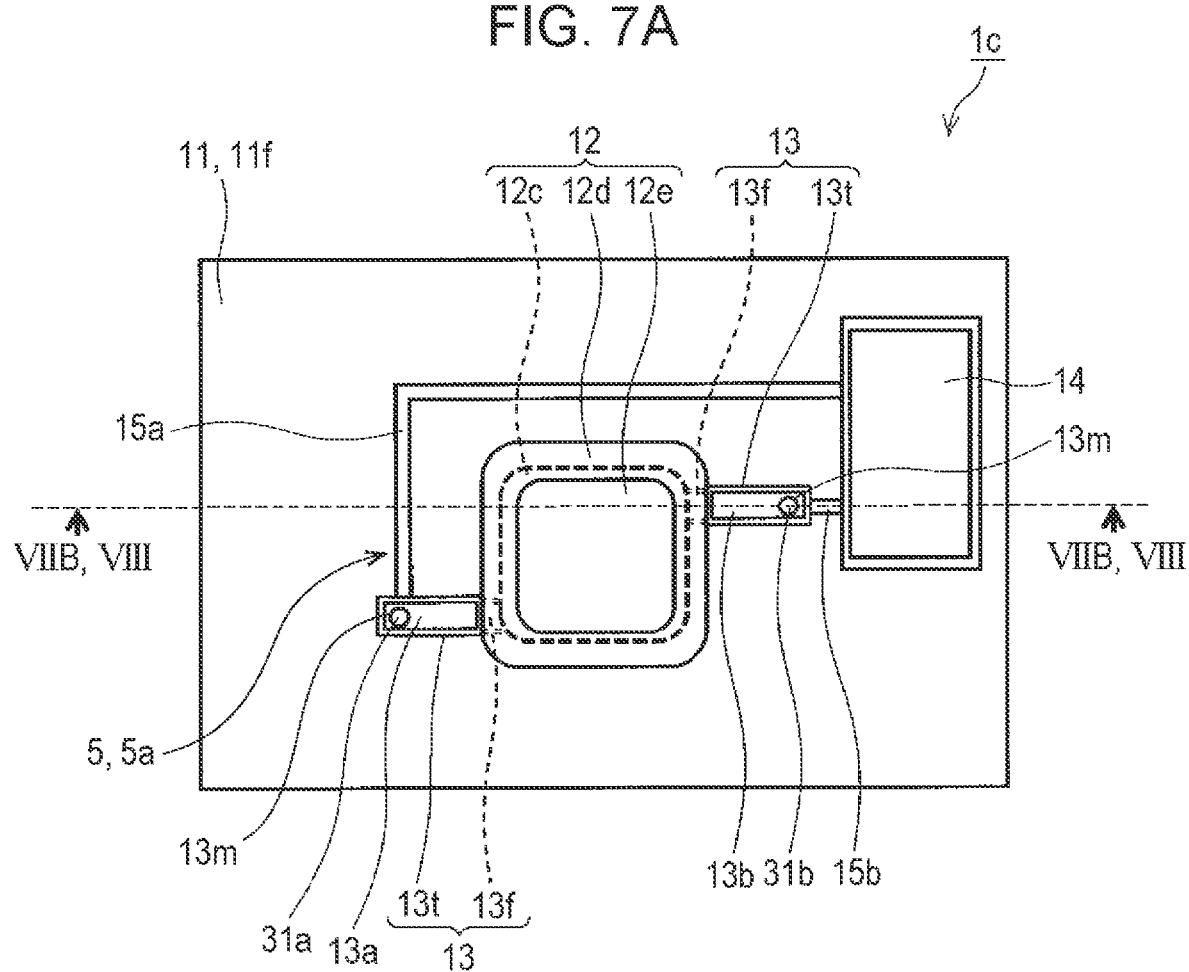
FIG. 7A is a plan view schematically illustrating an infrared sensor according to Embodiment 3.
Figure 7B:
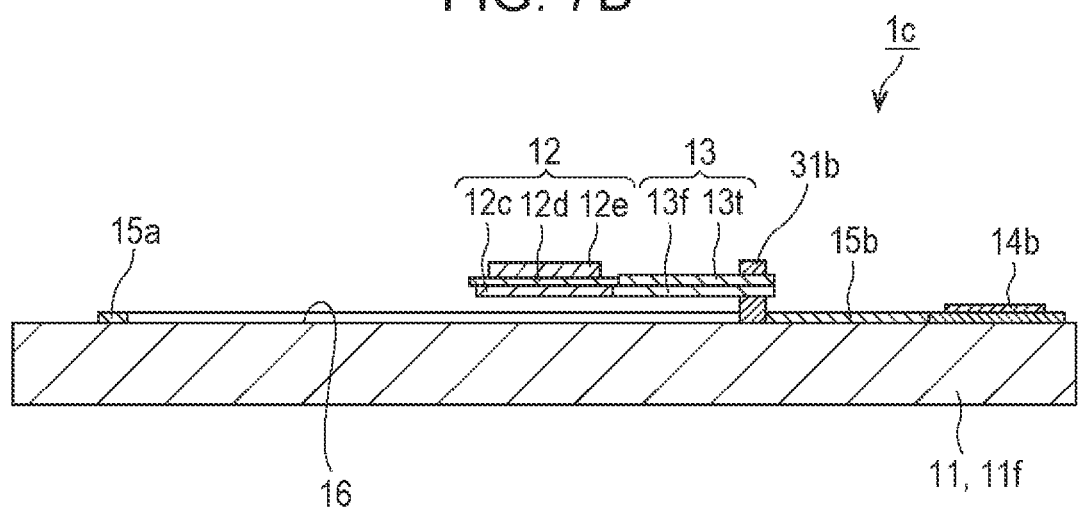
FIG. 7B is a cross section of the infrared sensor taken along the cutting plane line VIIB-VIIB in FIG. 7A.

FIGS. 7A and 7B illustrate an infrared sensor 1c according to Embodiment 3. FIG. 7B is a cross section of the infrared sensor 1c taken along the cutting plane line VIIB-VIIB illustrated in FIG. 7A. The infrared sensor 1c is configured similarly to the infrared sensor 1b, except for the portions specifically described otherwise. Components of the infrared sensor 1c which are identical or corresponding to the components of the infrared sensor 1b are denoted with the same signs, and a detailed description is omitted. The descriptions regarding the infrared sensor 1a and the infrared sensor 1b also apply to the infrared sensor 1c unless the result would be technically inconsistent.

The infrared sensor 1c is a thermopile infrared sensor, for example. Consequently, in the infrared sensor 1c, the infrared light receiver 12 is a thermopile infrared light receiver, for example.

As illustrated in FIGS. 7A and 7B, the infrared sensor 1c is provided with a first pillar 31a and the second pillar 31b. The first pillar 31a and the second pillar 31b are each disposed on the substrate 11 and extend in the direction going away from the surface of the substrate 11. The connected part 13m of the beam 13 is connected to each of the first pillar 31a and the second pillar 31b. The assemblage of the infrared light receiver 12 and the beam 13 is suspended above the substrate 11 by the first pillar 31a and the second pillar 31b. According to such a configuration, the ratio of the area of the infrared light receiver 12 occupying the area of the infrared sensor 1c in a plan view is increased easily. To a person skilled in the art, this ratio is known as the fill factor.

In the infrared sensor 1c, the first region 13a and the first interconnect 15a are electrically connected by the first pillar 31a. The second region 13b and the second interconnect 15b are electrically connected by the second pillar 31b.

The material of the first pillar 31a and the second pillar 31b is a conductive material. The conductive material is not limited to a specific material and is a metal material or a metallic compound, for example. The metal material is Cu, W, or Al, for example. The metallic compound is TaN or TiN, for example. However, the material of the first pillar 31a and the second pillar 31b is not limited to the above examples.

In the infrared sensor 1c, a first signal pathway 5a is formed by the first interconnect 15a, the second interconnect 15b, the first pillar 31a, the second pillar 31b, the second layer 12d of the infrared light receiver 12, the first region 13a, and the second region 13b. Note that in the infrared sensor 1c, the first interconnect 15a and the second interconnect 15b are each connected to a signal processing circuit 14.

In the infrared sensor 1c, an infrared reflective film may also be formed on the upper surface 16 of the substrate 11. According to such a configuration, the sensitivity of the infrared sensor 1c can be raised further. The material forming the infrared reflective film is not limited to a specific material insofar as infrared light can be reflected, and is Al, TaN, TiN, or Au, for example.

The infrared sensor 1c works on the same operating principle as the infrared sensor 1a.

An example of a method of manufacturing the infrared sensor 1c will be described. FIGS. 8A, 8B, 8C, and 8D are cross sections taken along cutting plane lines corresponding to the cutting plane line VIIB-VIIB in FIG. 7A in one example of a method of manufacturing the infrared sensor 1c. A method of manufacturing the infrared sensor 1c is not limited to the method below.

Figure 8A:
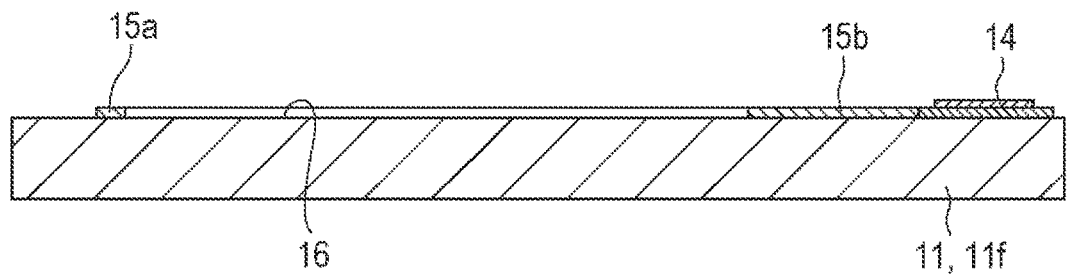
FIG. 8A is a cross section illustrating an example of a method of manufacturing the infrared sensor according to Embodiment 3.

As illustrated in FIG. 8A, first, the signal processing circuit 14, the first interconnect 15a, and the second interconnect 15b are formed on the upper surface 16 of the substrate 11. The signal processing circuit 14, the first interconnect 15a, and the second interconnect 15b can be formed by using known methods, including thin-film formation methods such as sputtering and vapor deposition and a pattern forming method such as photolithography. The infrared reflective film may also be formed on the upper surface 16 of the substrate 11 together with the signal processing circuit 14, the first interconnect 15a, and the second interconnect 15b.

Figure 8B:
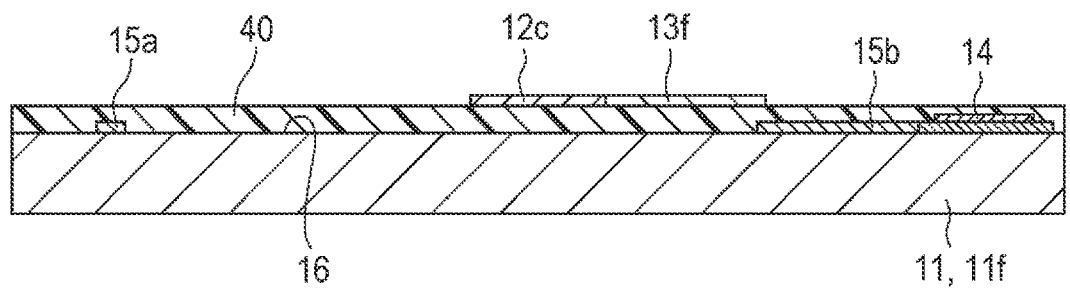
FIG. 8B is a cross section illustrating an example of a method of manufacturing the infrared sensor according to Embodiment 3.

Next, as illustrated in FIG. 8B, a sacrificial layer 40 is formed on the upper surface 16 of the substrate 11, and the base layer 13f and the first layer 12c are formed on the sacrificial layer 40. The sacrificial layer 40 can be formed to cover the signal processing circuit 14, the first interconnect 15a, and the second interconnect 15b. The material of the sacrificial layer 40 is typically a resin. The resin is polyimide, for example. The sacrificial layer 40 can be formed by known methods of forming a thin film, such as CVD, sputtering, and spin coating. The material of the base layer 13f is the same as that described in the second embodiment. The thickness of the base layer 13f is not limited to a specific value and may be equal to or greater than 10 nm and less than or equal to 500 nm, for example. Thereafter, the shapes of the beam 13 and the first layer 12c of the infrared light receiver 12 are formed by performing lithography and selectively etching the base layer 13f.

Figure 8C:
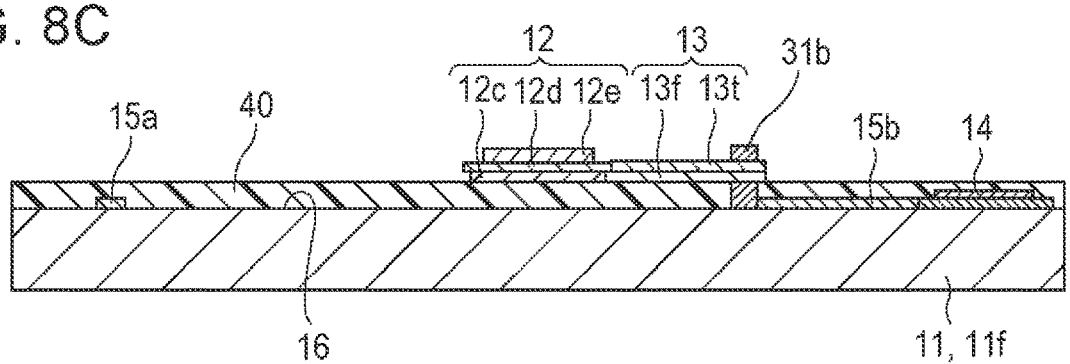
FIG. 8C is a cross section illustrating an example of a method of manufacturing the infrared sensor according to Embodiment 3.

Next, as illustrated in FIG. 8C, the thermocouple material layer 13t is formed on the base layer 13f. Thereafter, the first region 13a and the second region 13b are formed by performing lithography and selectively etching the thermocouple material layer 13t. In the case where the conductivity of the first region 13a and the second region 13b is adjusted by doping with a dopant, doping is performed locally. Next, the second layer 12d is formed on the first layer 12c, the third layer 12e is formed on the second layer 12d, and the infrared light receiver 12 is obtained. The first pillar 31a and the second pillar 31b are formed on the substrate 11. The photolithography and selective etching described above can be used to form the infrared light receiver 12. Selective etching and a thin-film formation method such as sputtering or vapor deposition can be used to form the first pillar 31a and the second pillar 31b. For example, spaces for forming the first pillar 31a and the second pillar 31b are formed by selective etching. Next, the first pillar 31a and the second pillar 31b are formed in the spaces according to a thin-film formation method such as sputtering or vapor deposition.

Figure 8D:
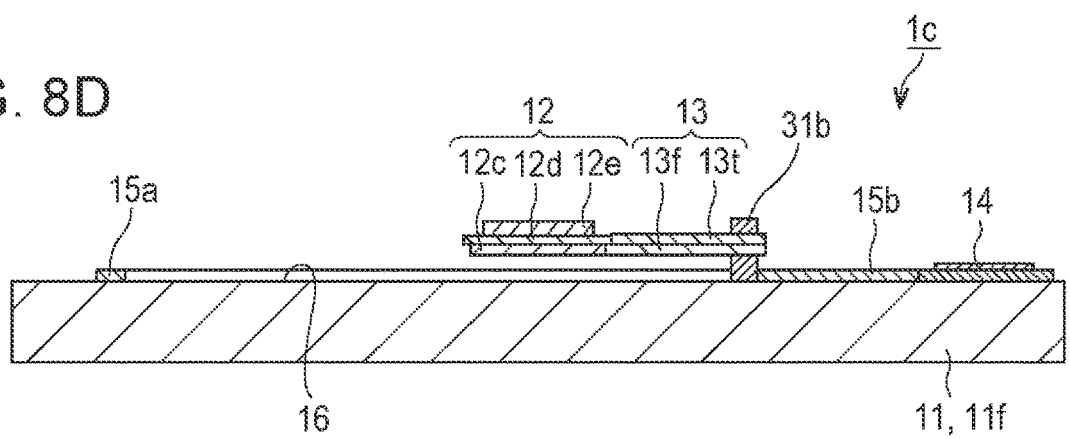
FIG. 8D is a cross section illustrating an example of a method of manufacturing the infrared sensor according to Embodiment 3.

Next, as illustrated in FIG. 8D, the sacrificial layer 40 is removed by selective etching, and the infrared sensor 1c is obtained.

Embodiment 4

Figure 9A:
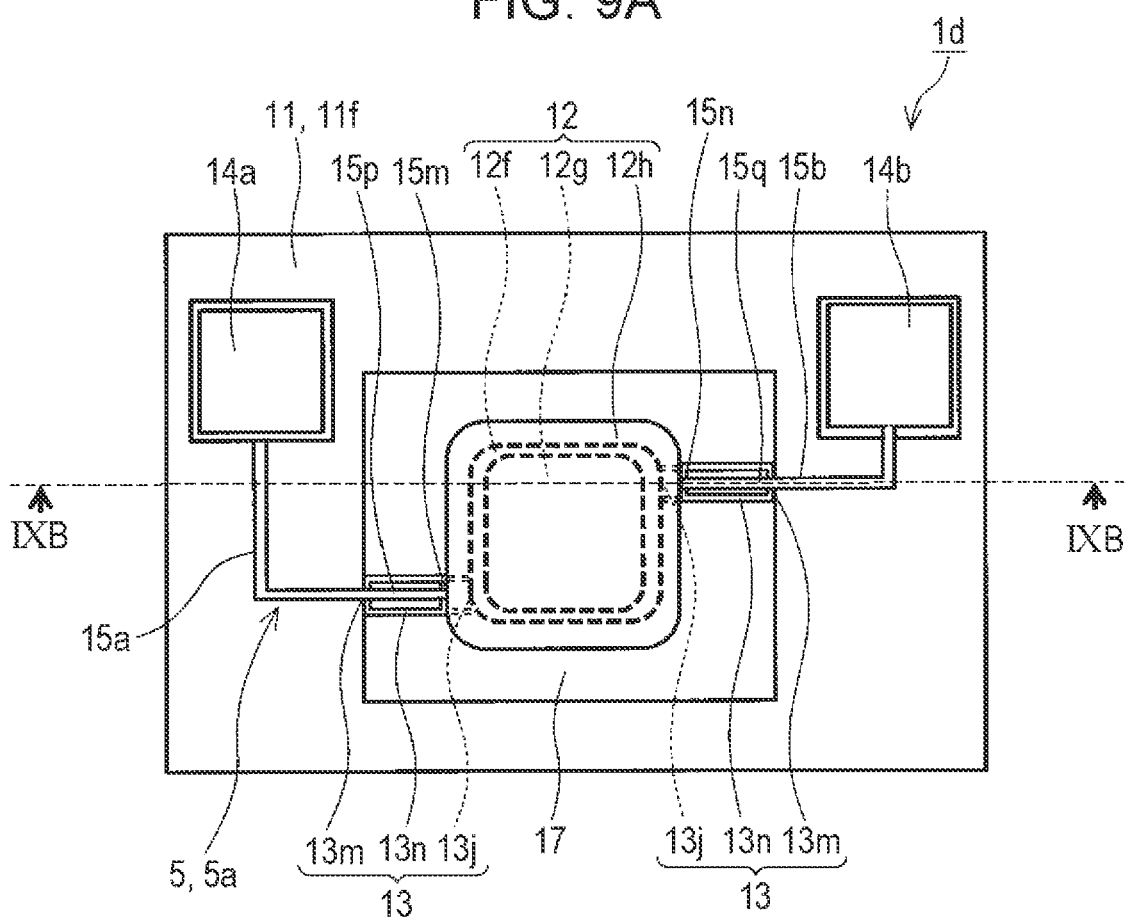
FIG. 9A is a plan view schematically illustrating an infrared sensor according to Embodiment 4.
Figure 9B:
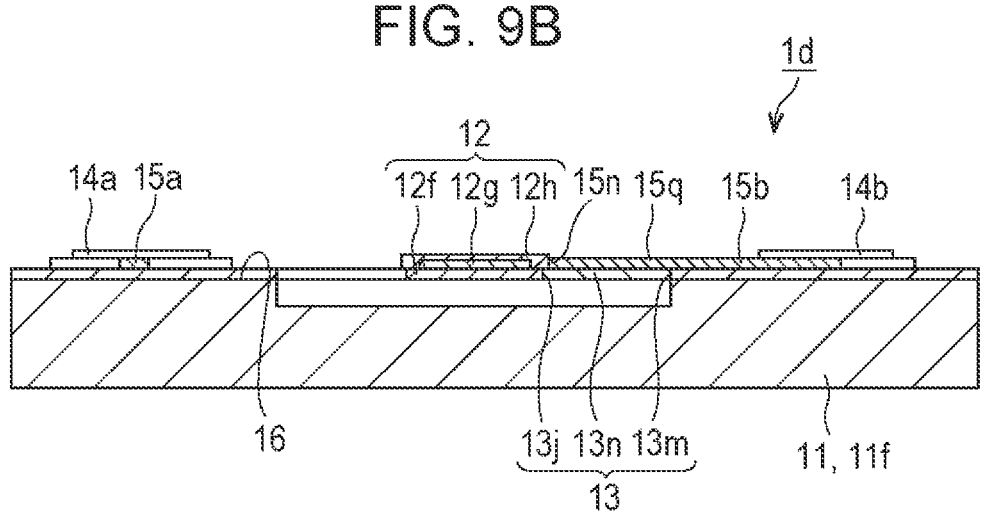
FIG. 9B is a cross section of the infrared sensor taken along the cutting plane line IXB-IXB in FIG. 9A.

FIGS. 9A and 9B illustrate an infrared sensor 1d according to Embodiment 4. FIG. 9B is a cross section of the infrared sensor 1d taken along the cutting plane line IXB-IXB illustrated in FIG. 9A. The infrared sensor 1d is configured similarly to the infrared sensor 1a, except for the portions specifically described otherwise. Components of the infrared sensor 1d which are identical or corresponding to the components of the infrared sensor 1a are denoted with the same signs, and a detailed description is omitted. The description regarding the infrared sensor 1a also applies to the infrared sensor 1d unless the result would be technically inconsistent.

The infrared sensor 1d is a bolometric infrared sensor. The infrared light receiver 12 in the infrared sensor 1d is a bolometric infrared light receiver. The infrared light receiver 12 has a resistance change layer 12h. The resistance change layer 12h is formed from a material whose electrical resistance changes in relation to a temperature change. The signal pathway 5 includes a first interconnect 15a and a second interconnect 15b. The first interconnect 15a connects the resistance change layer 12h and the first signal processing circuit 14a. The second interconnect 15b connects the resistance change layer 12h and the second signal processing circuit 14b. The first interconnect 15a has a first isolated part 15p. The first isolated part 15p is isolated from the substrate 11 between the first signal processing circuit 14a and a connected part 15m of the resistance change layer 12h and the first interconnect 15a. The second interconnect 15b has a second isolated part 15q. The second isolated part 15q is isolated from the substrate 11 between the second signal processing circuit 14b and a connected part 15n of the resistance change layer 12h and the second interconnect 15b.

The first interconnect 15a and the second interconnect 15b are each disposed on the substrate 11 and the beam 13, for example.

As illustrated in FIGS. 9A and 9B, the infrared light receiver 12 is provided with a first layer 12f, a second layer 12g, and the resistance change layer 12h. The resistance change layer 12h is larger than the second layer 12g in a plan viewing. The first layer 12f acts as a base layer, for example. The second layer 12g acts as an infrared absorption layer, for example.

The beam 13 has a connected part 13m connected to the substrate 11 and an isolated part 13n isolated from the substrate 11. The beam 13 and the first layer 12f are joined to each other at a junction 13j. The infrared light receiver 12 is supported in an isolated state from the substrate 11 by the beam 13 having the isolated part 13n. The beam 13 is a two-handed beam.

In the infrared sensor 1d, when infrared light is incident on the infrared light receiver 12, the temperature of the infrared light receiver 12 rises. At this time, the higher the thermal insulation performance between the infrared light receiver 12 and the substrate 11 and members disposed on the substrate 11 which act as a heat bath, the more the temperature of the infrared light receiver 12 rises. In the infrared light receiver 12, a change in electrical resistance occurs in relation to a temperature rise. A signal indicating the produced change in electrical resistance is processed by the signal processing circuit 14, and infrared light is sensed. Through signal processing, it is possible to measure at least one of the intensity of the infrared light or the temperature of an object with the infrared sensor 1d.

In the infrared sensor 1d, the first interconnect 15a and the second interconnect 15b respectively have the first isolated part 15p and the second isolated part 15q isolated from the substrate 11. The first isolated part 15p and the second isolated part 15q are each in contact with the surface of the beam 13, for example.

As described above, the resistance change layer 12h is formed from a material whose electrical resistance changes in relation to a temperature change. The material of the resistance change layer 12h is not limited to a specific material and is Pt, amorphous Si, or vanadium oxide, for example. These materials have a high temperature coefficient of resistance.

The material of the second layer 12g is not limited to a specific material and is a metal, such as Ti, Cr, Au, Al, or Cu, an oxide such as $SiO_2$, or a nitride such as TiN or SiN, for example.

The infrared sensor 1d can be manufactured by known methods, including thin-film formation methods such as sputtering and vapor deposition and microfabrication methods such as photolithography and selective etching. The infrared sensor 1d can also be manufactured by applying the method of manufacturing the infrared sensor 1a, for example.

Embodiment 5

Figure 10A:
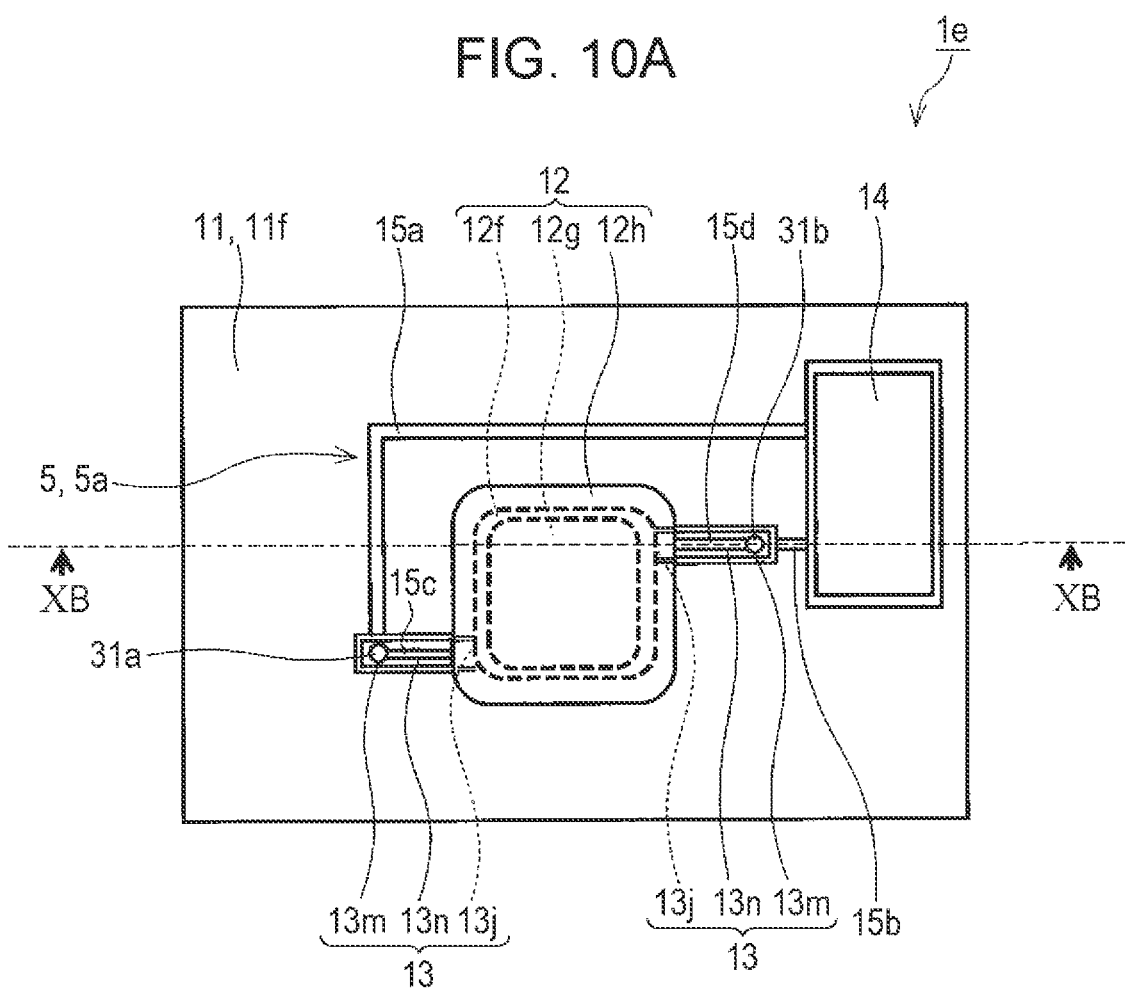
FIG. 10A is a plan view schematically illustrating an infrared sensor according to Embodiment 5.
Figure 10B:
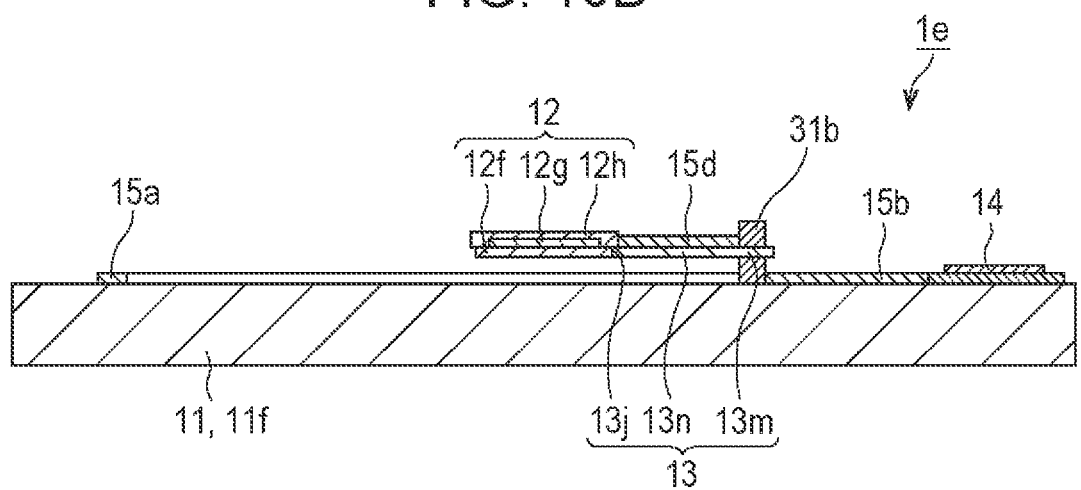
FIG. 10B is a cross section of the infrared sensor taken along the cutting plane line XB-XB in FIG. 10A.

FIGS. 10A and 10B illustrate an infrared sensor 1e according to Embodiment 5. FIG. 10B is a cross section of the infrared sensor 1e taken along the cutting plane line XB-XB illustrated in FIG. 10A. The infrared sensor 1e is configured similarly to the infrared sensor 1d, except for the portions specifically described otherwise. Components of the infrared sensor 1e which are identical or corresponding to the components of the infrared sensor 1d are denoted with the same signs, and a detailed description is omitted. The descriptions regarding the infrared sensors 1a and 1d also apply to the infrared sensor 1e unless the result would be technically inconsistent.

The infrared sensor 1e is a bolometric infrared sensor. The infrared sensor 1e is provided with a first pillar 31a and a second pillar 31b. The first pillar 31a and the second pillar 31b are each disposed on the substrate 11 and extend in the direction going away from the surface of the substrate 11. The connected part 13m of the beam 13 is connected to each of the first pillar 31a and the second pillar 31b. The beam 13 has an isolated part 13n isolated from the substrate 11. The assemblage of the infrared light receiver 12 and the beam 13 is suspended above the substrate 11 by the first pillar 31a and the second pillar 31b.

The beam 13 and the first layer 12f of the infrared light receiver 12 are joined to each other at a junction 13j. The infrared light receiver 12 is supported in an isolated state from the substrate 11 by the beam 13 having the isolated part 13n. The beam 13 is a two-handed beam.

In the infrared sensor 1e, the first interconnect 15a and the second interconnect 15b are electrically connected to the first pillar 31a and the second pillar 31b, respectively. The first interconnect 15a and the second interconnect 15b are in contact with the substrate 11. The infrared sensor 1e is further provided with a third interconnect 15c and a fourth interconnect 15d. The third interconnect 15c electrically connects the resistance change layer 12h of the infrared light receiver 12 and the first pillar 31a. The fourth interconnect 15d electrically connects the resistance change layer 12h and the second pillar 31b. The third interconnect 15c and the fourth interconnect 15d are in contact with the beam 13 having the isolated part 13n, and are isolated from the substrate 11. In the infrared sensor 1e, the first interconnect 15a, the second interconnect 15b, the third interconnect 15c, the fourth interconnect 15d, the resistance change layer 12h of the infrared light receiver 12, the first pillar 31a, and the second pillar 31b are electrically connected. With this arrangement, a first signal pathway 5a is formed.

The infrared sensor 1e works on the same operating principle as the infrared sensor 1d.

The infrared sensor 1e can be manufactured by known methods, including thin-film formation methods such as sputtering and vapor deposition and microfabrication methods such as photolithography and selective etching, for example. The infrared sensor 1e can also be manufactured by applying the above-described method of manufacturing the infrared sensor 1c.

Embodiment 6

Figure 11:
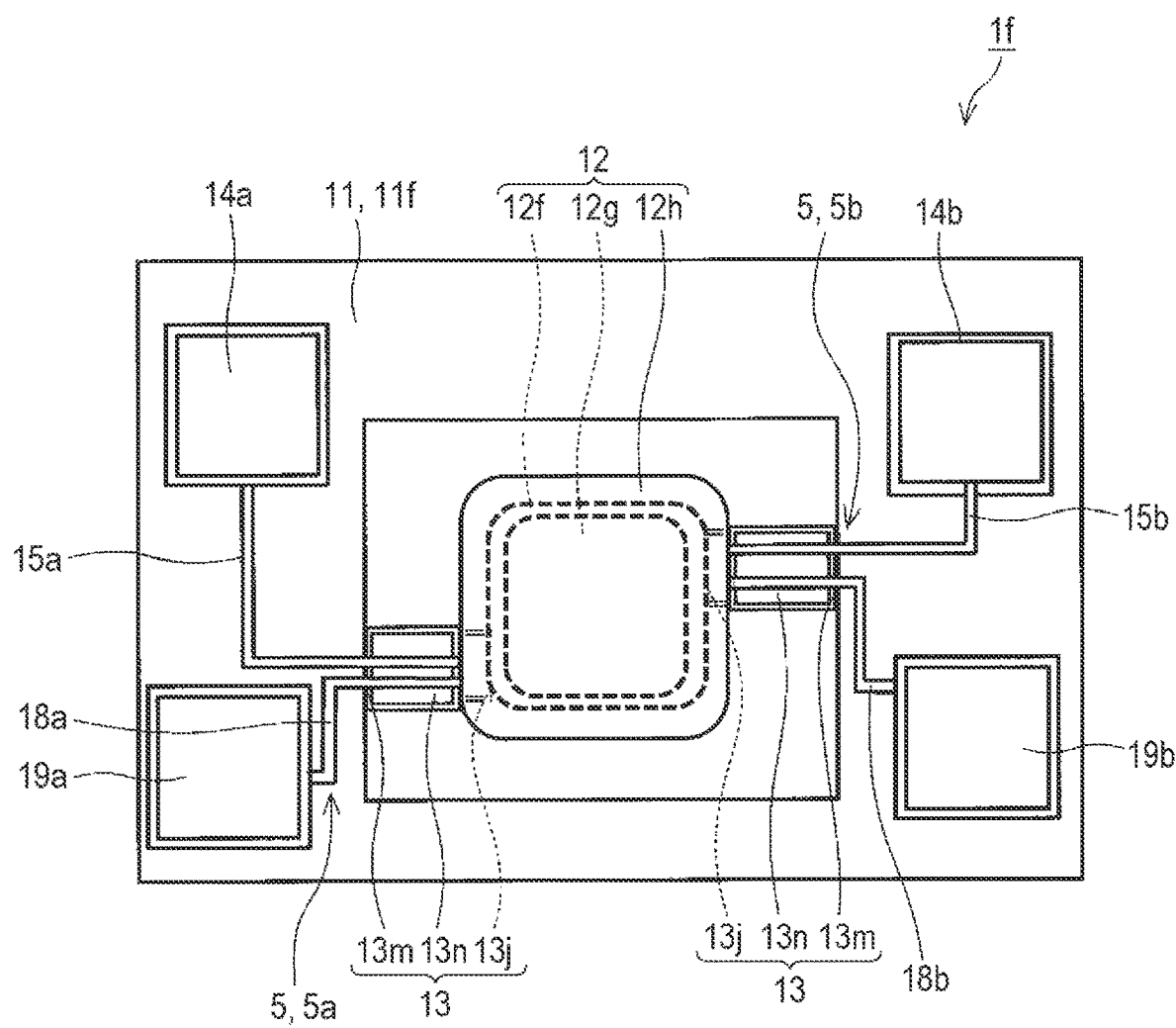
FIG. 11 is a plan view schematically illustrating an infrared sensor according to Embodiment 6.

FIG. 11 illustrates an infrared sensor 1f according to Embodiment 6. The infrared sensor 1f is configured similarly to the infrared sensor 1d, except for the portions specifically described otherwise. Components of the infrared sensor 1f which are identical or corresponding to the components of the infrared sensor 1d are denoted with the same signs, and a detailed description is omitted. The descriptions regarding the infrared sensors 1a and 1d also apply to the infrared sensor 1f unless the result would be technically inconsistent.

The infrared sensor 1f is a bolometric infrared sensor. In the infrared sensor 1f, the signal pathway 5 further includes a second signal pathway 5b. A signal for sensing the reception of infrared light by the infrared light receiver 12 travels along the second signal pathway 5b. The first signal pathway 5a is independent from the second signal pathway 5b.

The infrared sensor 1f is provided with a first input interconnect 18a, a second input interconnect 18b, a first driving signal output circuit 19a, and a second driving signal output circuit 19b, for example. The first input interconnect 18a and the second input interconnect 18b are each electrically connected to the resistance change layer 12h of the infrared light receiver 12. With this arrangement, a first signal pathway 5a is formed. On the other hand, the second signal pathway 5b is formed by the first interconnect 15a, the second interconnect 15b, and the resistance change layer 12h. As described above, a signal for sensing the reception of infrared light by the infrared light receiver 12 travels along the second signal pathway 5b. In other words, the second signal pathway 5b is used in the sensing of infrared light. On the other hand, the driving signal Sd travels along the first signal pathway Sa. In other words, the first signal pathway 5a is used to apply the driving signal Sd for deforming the infrared light receiver 12 to a prescribed radius of curvature. In the infrared sensor 1f, the first signal processing circuit 14a and the second signal processing circuit 14b are circuits for sensing infrared light. In addition, the first driving signal output circuit 19a and the second driving signal output circuit 19b are circuits for applying the driving signal Sd to the infrared light receiver 12. According to such a configuration, the circuits for sensing infrared light and the circuits for applying the driving signal Sd to the infrared light receiver 12 can be separated from each other. As a result, the infrared sensor 1f is easily controlled. Moreover, the infrared sensor 1f is easily manufactured.

The infrared sensor 1f can be manufactured by known methods, including thin-film formation methods such as sputtering and vapor deposition and microfabrication methods such as photolithography and selective etching, for example. The infrared sensor 1f can also be manufactured by applying the above-described method of manufacturing the infrared sensor 1d.

An infrared sensor according to the present disclosure can be used for various purposes, including the purposes of infrared sensors of the related art.

What is claimed is:

1. An infrared sensor comprising:
   an infrared light receiver;
   a signal pathway; and
   a first member, wherein
   the infrared light receiver has a structure in which at least two materials having different coefficients of thermal expansion are layered,
   the signal pathway includes a first signal pathway allowing passage of a driving signal to be applied to the infrared light receiver,
   the driving signal has a current value equal to or greater than a prescribed magnitude, and
   the infrared light receiver deforms in response to the application of the driving signal to the infrared light receiver, thereby at least a portion of the infrared light receiver contacting the first member.

2. The infrared sensor according to claim 1, wherein stopping the application of the driving signal causes the infrared light receiver to separate from the first member.

3. The infrared sensor according to claim 1, further comprising:
   a substrate; and
   a beam, wherein
   the beam has a connected part connected to at least one of a second member disposed on the substrate or the substrate,
   the beam has an isolated part isolated from the substrate, and
   the infrared light receiver is joined to the isolated part of the beam and supported in an isolated state from the substrate.

4. The infrared sensor according to claim 3, wherein the first member is the substrate.

5. The infrared sensor according to claim 2, wherein the infrared light receiver is a thermopile infrared light receiver and the beam has a single-layer structure.

6. The infrared sensor according to claim 2, wherein the infrared light receiver is a thermopile infrared light receiver,
   the beam has a base layer and a thermocouple material layer disposed on the base layer, and
   the thermocouple material layer has a first region and a second region formed from a material having a Seebeck coefficient that is different from the Seebeck coefficient of a material forming the first region.

7. The infrared sensor according to claim 2, wherein the infrared light receiver is a bolometric infrared light receiver including a resistance change layer formed from a material whose electrical resistance changes in relation to a temperature change,
   the signal pathway includes a first interconnect that connects the resistance change layer and a first signal processing circuit and a second interconnect that connects the resistance change layer and a second signal processing circuit,
   the first interconnect has a first isolated part isolated from the substrate between the first signal processing circuit and a connected part of the resistance change layer and the first interconnect, and
   the second interconnect has a second isolated part isolated from the substrate between the second signal processing circuit and a connected part of the resistance change layer and the second interconnect.

8. The infrared sensor according to claim 3, wherein the substrate has a recess formed between the substrate and an assemblage of the infrared light receiver and the beam, and
   the assemblage is suspended above the recess.

9. The infrared sensor according to claim 2, further comprising:
   a pillar which is disposed on the substrate and extends in a direction going away from a surface of the substrate, wherein
   the connected part of the beam is connected to the pillar, and
   an assemblage of the infrared light receiver and the beam is suspended over the substrate by the pillar.

10. The infrared sensor according to claim 1, wherein the signal pathway further includes a second signal pathway allowing passage of a signal for sensing a reception of infrared light by the infrared light receiver, and
    the first signal pathway is independent from the second signal pathway.

11. A method of controlling an infrared sensor, the method comprising:
    performing sensing a prescribed number of times per second with the infrared sensor according to any one of claims 1 to 10; and
    regulating, in a period for applying the driving signal to the infrared light receiver on a cycle equal to a cycle of the sensing and sensing infrared light with the infrared sensor, the application of the driving signal to maximize a radius of curvature of the infrared light receiver.

12. The method of controlling an infrared sensor according to claim 11, wherein
    a temperature of the infrared light receiver when the infrared light receiver is receiving the infrared light is lower than a temperature of the infrared light receiver when the driving signal is being applied to the infrared light receiver.

* * * * *